US012610874B2

(12) United States Patent
Aizawa et al.

(10) Patent No.: US 12,610,874 B2
(45) Date of Patent: Apr. 21, 2026

(54) CONNECTION STRUCTURAL BODY WITH CU—CU BONDING AND ROUGHENED SURFACE DEPOSITS

(71) Applicants: SHINKO ELECTRIC INDUSTRIES CO., LTD., Nagano (JP); SHINSHU UNIVERSITY, Nagano (JP)

(72) Inventors: Mitsuhiro Aizawa, Nagano (JP); Susumu Arai, Nagano City (JP)

(73) Assignees: SHINKO ELECTRIC INDUSTRIES CO., LTD., Nagano (JP); SHINSHU UNIVERSITY, Matsumoto City (JP)

( * ) Notice: Subject to any disclaimer, the term of this patent is extended or adjusted under 35 U.S.C. 154(b) by 465 days.

(21) Appl. No.: 18/172,529

(22) Filed: Feb. 22, 2023

(65) Prior Publication Data

US 2023/0317650 A1      Oct. 5, 2023

(30) Foreign Application Priority Data

Feb. 28, 2022    (JP) ................................ 2022-030088

(51) Int. Cl.
*H01L 23/498*          (2006.01)
*H01L 23/00*           (2006.01)
                    (Continued)

(52) U.S. Cl.
CPC ........ *H01L 24/05* (2013.01); *H01L 23/49816* (2013.01); *H01L 23/49838* (2013.01);
                    (Continued)

(58) Field of Classification Search
CPC ......... H01L 2224/04; H01L 2224/0401; H01L 24/05–09; H01L 24/13–14;
                    (Continued)

(56) References Cited

U.S. PATENT DOCUMENTS

2012/0305298 A1* 12/2012 Uang ....................... H05K 3/32
                                                                228/205
2013/0087912 A1     4/2013 Shimizu
                    (Continued)

FOREIGN PATENT DOCUMENTS

JP          2013-093547 A      5/2013

OTHER PUBLICATIONS

Liu et al, "Interfacial void ripening in Cu—Cu joints", Nov. 2021, Materials Characterization, (Year: 2021).*

*Primary Examiner* — Wael M Fahmy
*Assistant Examiner* — Aneesa Riaz Baig
(74) *Attorney, Agent, or Firm* — Tarolli, Sundheim, Covell & Tummino LLP

(57)          ABSTRACT

A connection structural body includes: a first connection terminal including a first opposing surface; a first roughened-surface copper metal film formed on the first opposing surface; a second connection terminal including a second opposing surface facing the first opposing surface; and a second roughened-surface copper metal film formed on the second opposing surface and bonded to the first roughened-surface copper metal film. The first roughened-surface copper metal film includes a structure in which first deposits of copper are piled over one another on the first opposing surface. The second roughened-surface copper metal film includes a structure in which second deposits of copper are piled over one another on the second opposing surface. A bonded portion of the first and second roughened-surface copper metal films includes a structure in which the first deposits and the second deposits are piled such that the bonded portion includes pores.

10 Claims, 16 Drawing Sheets

(51) Int. Cl.

| | |
|---|---|
| *H10D 1/60* | (2025.01) |
| *H10D 30/01* | (2025.01) |
| *H10D 30/47* | (2025.01) |
| *H10D 62/85* | (2025.01) |
| *H10D 64/23* | (2025.01) |
| *H10D 64/68* | (2025.01) |

(52) U.S. Cl.

CPC ........ *H01L 23/49866* (2013.01); *H01L 24/03* (2013.01); *H01L 24/08* (2013.01); *H01L 24/80* (2013.01); *H01L 2224/03462* (2013.01); *H01L 2224/05073* (2013.01); *H01L 2224/05147* (2013.01); *H01L 2224/05562* (2013.01); *H01L 2224/05564* (2013.01); *H01L 2224/05573* (2013.01); *H01L 2224/05647* (2013.01); *H01L 2224/08238* (2013.01); *H01L 2224/80203* (2013.01); *H01L 2224/8083* (2013.01); *H01L 2224/8084* (2013.01); *H01L 2924/1431* (2013.01); *H01L 2924/1432* (2013.01); *H01L 2924/1436* (2013.01); *H01L 2924/1437* (2013.01); *H01L 2924/1438* (2013.01); *H01L 2924/3512* (2013.01)

(58) Field of Classification Search

CPC .............. H01L 24/16–17; H01L 24/26; H01L 23/49866; H01L 23/49811; H01L 23/49816; H01L 23/49838; H01L 23/49822; H01L 21/4853; H01L 21/4857; H01L 2224/05647; H01L 2224/05147; H01L 2224/05599; H01L 2224/13647; H01L 2224/29647; H01L 2224/808; H01L 2224/8084; H01L 2224/80862; H01L 2224/0346–03464; H01L 24/81; H01L 2224/80895

See application file for complete search history.

(56) References Cited

U.S. PATENT DOCUMENTS

| | | | |
|---|---|---|---|
| 2015/0024555 A1 | 1/2015 | Shimizu | |
| 2018/0237644 A1* | 8/2018 | Lee ........................... | H01B 1/02 |
| 2021/0225801 A1* | 7/2021 | Uzoh ....................... | H01L 25/50 |
| 2021/0242166 A1* | 8/2021 | Huang .................... | H01L 24/16 |
| 2022/0285303 A1* | 9/2022 | Mirkarimi ............... | H01L 24/08 |

* cited by examiner (Comparative Example)

(Comparative Example)

CONNECTION STRUCTURAL BODY WITH CU—CU BONDING AND ROUGHENED SURFACE DEPOSITS

CROSS-REFERENCE TO RELATED APPLICATIONS

This application is based upon and claims the benefit of priority from prior Japanese Patent Application No. 2022-030088, filed on Feb. 28, 2022, the entire contents of which are incorporated herein by reference.

FIELD

This disclosure relates to a connection structural body, a semiconductor device, and a method for manufacturing a connection structural body.

BACKGROUND

Japanese Laid-Open Patent Publication No. 2013-93547 describes a semiconductor device that bonds an electrode pad of a semiconductor element and a connection terminal of a wiring substrate with a solder layer.

SUMMARY

The pitch between connection terminals of a wiring substrate has become narrower as a result of sophistication of semiconductor elements. However, when the pitch of the connection terminals becomes narrower, short-circuiting is more likely to occur between adjacent solder layers after reflow soldering is performed. Short-circuiting between adjacent solder layers leads to short-circuiting between adjacent connection terminals.

In one embodiment, a connection structural body includes a first connection terminal, a first roughened-surface copper metal film, a second connection terminal, and a second roughened-surface copper metal film. The first connection terminal includes a first opposing surface. The first roughened-surface copper metal film is formed on the first opposing surface. The second connection terminal includes a second opposing surface facing the first opposing surface. The second roughened-surface copper metal film is formed on the second opposing surface and bonded to the first roughened-surface copper metal film. The first roughened-surface copper metal film includes a structure in which first deposits of copper are piled over one another on the first opposing surface. The second roughened-surface copper metal film includes a structure in which second deposits of copper are piled over one another on the second opposing surface. A bonded portion of the first roughened-surface copper metal film and the second roughened-surface copper metal film includes a structure in which the first deposits and the second deposits are piled such that the bonded portion includes pores.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1:
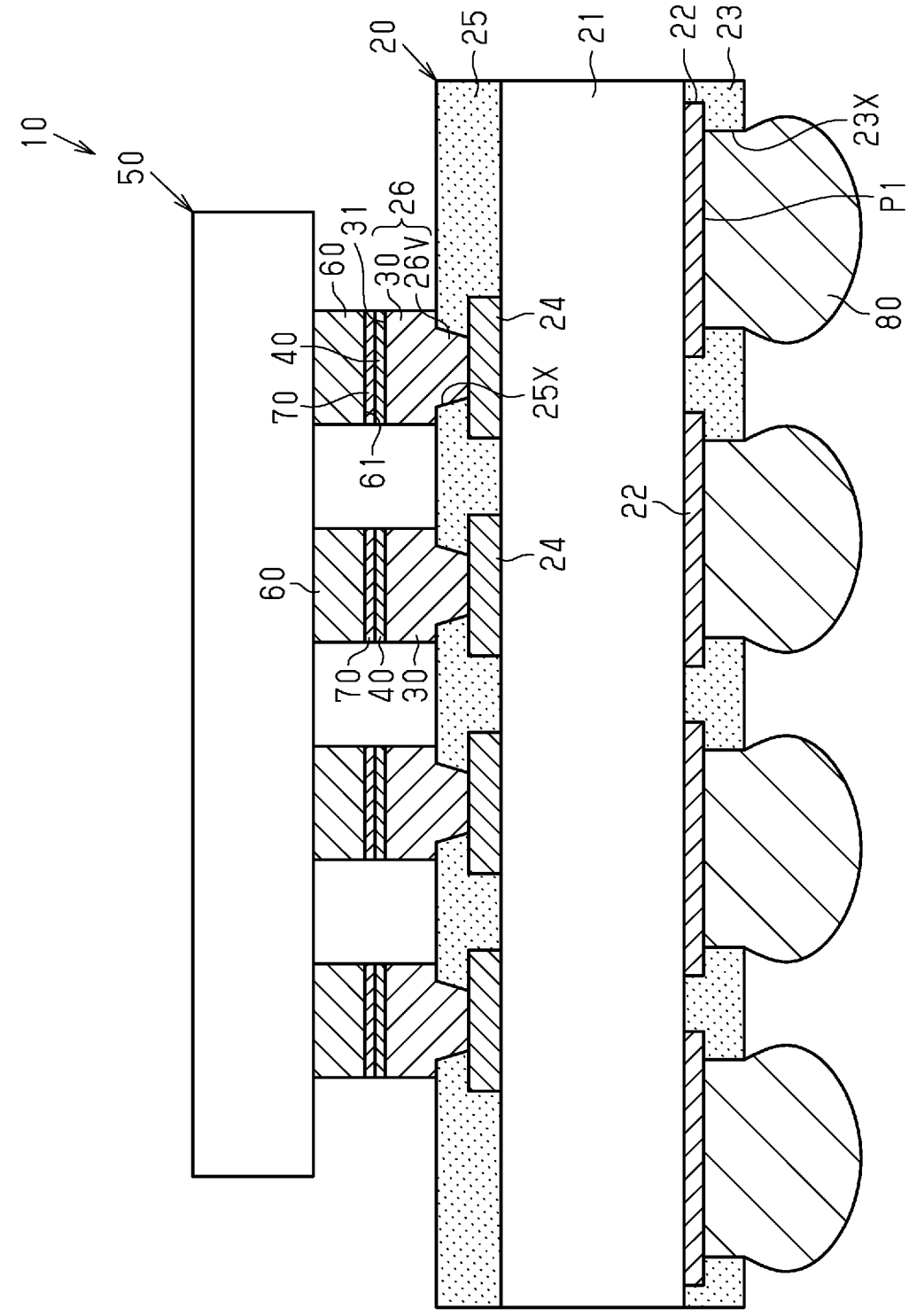
FIG. 1 is a schematic cross-sectional view of a semiconductor device in accordance with a first embodiment.

Embodiments will now be described with reference to the drawings. The drawings may not be to scale, and the relative size, proportions, and depiction of elements in the drawings may be exaggerated for clarity, illustration, and convenience. Also, to facilitate understanding, hatching lines may not be illustrated or be replaced by shadings in the cross-sectional drawings. In the present specification, "plan view" refers to a view of a subject taken in a perpendicular direction (for example, up-down direction in FIG. 1). Further, "planar shape" refers to a shape of a subject viewed in the perpendicular direction. In the present specification, "up-down direction" and "left-right direction" refer to directions when the drawings are oriented to an appropriate position allowing reference numerals of the elements to be read correctly. Moreover, in the present specification, "parallel", "orthogonal", and "perpendicular" include not only strictly parallel, strictly orthogonal, and strictly perpendicular cases but also include generally parallel, generally orthogonal, and generally perpendicular cases within a range allowing the same advantages to be obtained.

First Embodiment

A first embodiment will now be described with reference to FIGS. 1 to 8.

Semiconductor Device 10

As illustrated in FIG. 1, a semiconductor device 10 includes a wiring substrate 20, one or more semiconductor elements 50 (one semiconductor element 50 in this case), and external connection terminals 80.

Wiring Substrate 20

The wiring substrate 20 includes, for example, a substrate body 21. A wiring layer 22 and a solder resist layer 23 are formed on a lower surface of the substrate body 21 in this order. A wiring layer 24, an insulating layer 25, a wiring layer 26, and a first roughened-surface copper metal film 40 are formed on an upper surface of the substrate body 21 in this order.

The substrate body 21 may be, for example, a wiring structural body in which insulating resin layers and wiring layers are alternately arranged one upon another. The wiring structural body may include, for example, a substrate core. Alternatively, the wiring structural body does not have to include a substrate core. The material of the insulating resin layer may be, for example, a thermosetting insulating resin. The thermosetting insulating resin may be, for example, an insulating resin such as an epoxy resin, a polyimide resin, or a cyanate resin. Further, the material of the insulating resin layer may be, for example, an insulating resin having a photosensitive resin, such as a phenol-based resin or a polyimide-based resin, as a main component. The insulating resin layer may include, for example, a filler such as silica or alumina.

The material of the wiring layers of the substrate body 21 and the wiring layers 22 and 24 may be, for example, copper (Cu) or a copper alloy. The material of the solder resist layer 23 may be, for example, an insulating resin having a photosensitive resin, such as a phenol-based resin or a polyimide-based resin, as a main component. The solder resist layer 23 may include, for example, a filer such as silica or alumina.

Wiring Layer 22

The wiring layer 22 is formed on the lower surface of the substrate body 21. The wiring layer 22 is the lowermost wiring layer of the wiring substrate 20.

Solder Resist Layer 23

The solder resist layer 23 is formed on the lower surface of the substrate body 21 and covers the wiring layer 22. The solder resist layer 23 is an outermost insulating layer (here, lowermost insulating layer) of the wiring substrate 20.

The solder resist layer 23 includes a plurality of openings 23X formed to expose parts of a lower surface of the wiring layer 22 as external connection pads P1. The external connection terminals 80 are respectively connected to the external connection pads P1 and used to mount the wiring substrate 20 on a mounting board such as a motherboard or the like.

When necessary, a surface-processed layer is formed on the lower surface of the wiring layer 22, which is exposed from the bottom of each opening 23X. Examples of the surface-processed layer include a gold (Au) layer, a nickel (Ni) layer/Au layer (metal layer in which Au layer is formed on Ni layer with Ni layer serving as bottom layer), a Ni layer/palladium (Pd) layer/Au layer (metal layer in which Ni layer, Pd layer, and Au layer are formed in this order with Ni layer serving as bottom layer), or the like. Examples of the surface-processed layer further include a Ni layer/Pd layer (metal layer in which Pd layer is formed on Ni layer with Ni layer serving as bottom layer), a Pd layer/Au layer (metal layer in which Au layer is formed on Pd layer with Pd layer serving as bottom layer), or the like. The Au layer is a metal layer of Au or a Au alloy. The Ni layer is a metal layer of Ni or a Ni alloy. The Pd layer is a metal layer of Pd or a Pd alloy. The Au layer, Ni layer, and Pd layer may each be, for example, a metal layer (electroless plating layer) formed by an electroless plating process or a metal layer (electrolytic plating layer) formed by an electrolytic plating process. Further, the surface-processed layer may be an organic solderability preservative (OPS) film formed by performing an antioxidation process such as an OSP process on the lower surface of the wiring layer 22, which is exposed from the openings 23X. The OSP film may be an organic coating of an azole compound, an imidazole compound, or the like. When the surface-processed layer is formed on the lower surface of the wiring layer 22, the surface-processed layer functions as the external connection pads P1.

In the example illustrated in FIG. 1, the external connection terminals 80 are arranged on the lower surface of the wiring layer 22. Alternatively, the wiring layer 22 exposed from the openings 23X or the surface-processed layer formed on the lower surface of the wiring layer 22 may be used as the external connection terminals.

Wiring Layer 24

The wiring layer 24 is formed on the upper surface of the substrate body 21. The wiring layer 24 is electrically connected to the wiring layer 22 via, for example, one or more wiring layers and one or more through-electrodes in the substrate body 21.

Insulating Layer 25

The insulating layer 25 is formed on the upper surface of the substrate body 21 and covers parts of the wiring layer 24. The insulating layer 25 is an outermost insulating layer (here, uppermost insulating layer) of the wiring substrate 20. The insulating layer 25 may be, for example, the same insulating layer as the insulating layer of the substrate body 21. Alternatively, the insulating layer 25 may be, for example, a solder resist layer. The material of the solder resist layer serving as the insulating layer 25 may be, for example, the same material as the solder resist layer 23.

The insulating layer 25 includes open portions 25X extending through the insulating layer 25 in a thickness-wise direction (up-down direction in FIG. 1) to expose parts of an upper surface of the wiring layer 24. The open portion 25X may have any planar shape and any size. In the example illustrated in FIG. 1, each open portion 25X has a circular planar shape. For example, the open portion 25X is tapered so that an opening width (opening diameter) decreases from the upper side in FIG. 1 (upper surface of insulating layer 25) toward the lower side (wiring layer 24).

Wiring Layer 26

The wiring layer 26 is formed on the wiring layer 24, which is exposed from the open portions 25X. The wiring layer 26 includes, for example, via wiring 26V and first connection terminals 30. The via wiring 26V is formed in the open portions 25X. The first connection terminals 30 are formed on the upper surface of the insulating layer 25 and electrically connected to the wiring layer 24 by the via wiring 26V. The first connection terminals 30 function as, for example, electronic component mounting pads that are electrically connected to an electronic component, such as the semiconductor element 50.

The via wiring 26V, for example, fills the open portion 25X and is shaped in correspondence with the open portions 25X. The via wiring 26V has the form of, for example, a reversed truncated cone in which the diameter of the upper surface is greater than the diameter of the lower surface.

Each first connection terminal 30 has the form of, for example, a rod projecting upward from the upper surface of the insulating layer 25. The first connection terminal 30 is, for example, a metal post. In the example illustrated in FIG. 1, the first connection terminal 30 is cylindrical. For example, the first connection terminal 30 is formed integrally with the via wiring 26V. The first connection terminal 30 may have any planar shape and any size. The first connection terminal 30 may have a circular planar shape in which the diameter is in, for example, a range from 15 μm or greater to 40 μm or less. The first connection terminal 30 may have a thickness, for example, in a range from 2 μm or greater to 50 μm or less.

The first connection terminal 30 includes a first opposing surface 31 (here, upper surface) facing the semiconductor element 50. The first opposing surface 31 of the first connection terminal 30 is, for example, a flat surface. The first opposing surface 31 extends parallel to, for example, the upper surface of the substrate body 21. The first opposing surface 31 is, for example, a rather even smooth surface.

In the present specification, "opposing" refers to a case in which two surfaces or two members face each other. Here, "opposing" refers not only to a case in which two parts are entirely facing each other but also to a case in which two parts are partially facing each other. Further, "opposing" includes both a case in which another member is located between the two parts and a case in which no member is located between the two parts.

The material of the via wiring 26V and the first connection terminal 30 may be, for example, copper or a copper alloy. In the example illustrated in FIG. 1, the first connection terminal 30 is formed from copper. The via wiring 26V and the first connection terminal 30 may each be, for example, an electroless plating layer formed in an electroless plating process or an electrolytic plating layer formed in an electrolytic plating process.

First Roughened-Surface Copper Metal Film 40

The first roughened-surface copper metal film 40 is formed on the first opposing surface 31 of each first connection terminal 30. The first roughened-surface copper metal film 40, for example, entirely covers the first opposing surface 31. The first roughened-surface copper metal film 40 exposes, for example, the side surface of the first connection terminal 30. In other words, in the example illustrated in FIG. 1, the first roughened-surface copper metal film 40 covers only the first opposing surface 31 among all of the surfaces of the first connection terminal 30. The first roughened-surface copper metal film 40 may have a thickness (film thickness), for example, in a range from 1 μm or greater to 5 μm or less.

Figure 2:
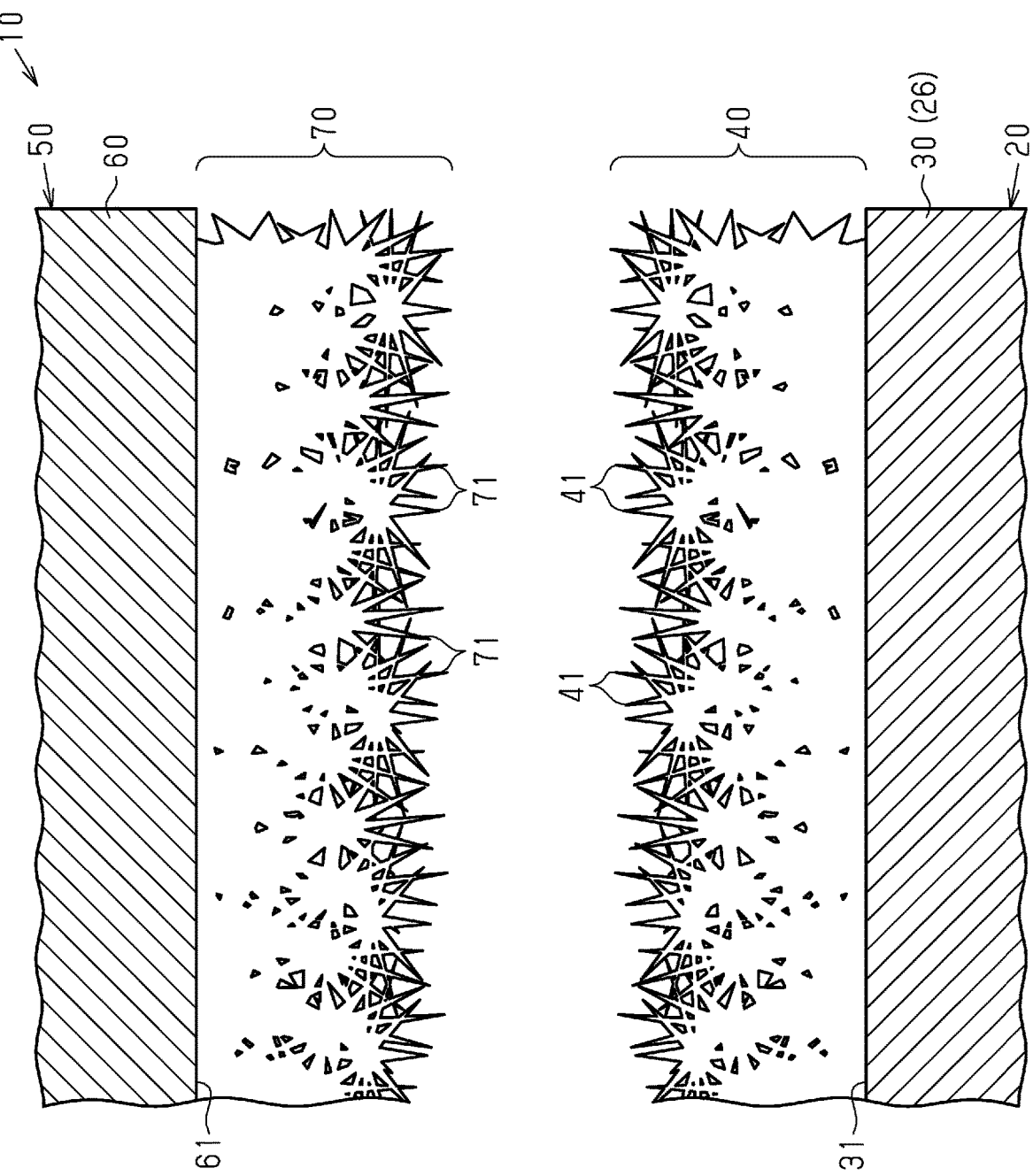
FIG. 2 is a schematic exploded cross-sectional view illustrating part of the semiconductor device in FIG. 1.

As illustrated in FIG. 2, the first roughened-surface copper metal film 40 is a plating film having a roughened surface (both upper and side surfaces or only upper surface). The surface (roughened surface) of the first roughened-surface copper metal film 40 includes microscopic irregularities. The first roughened-surface copper metal film 40 includes a structure in which first deposits 41 of copper are piled over one another on the first opposing surface 31 of the first connection terminal 30. The first deposits 41 may be flat bodies formed from copper. The first roughened-surface copper metal film 40 is a plating film formed in an electrolytic copper plating process. The first roughened-surface copper metal film 40 is, for example, a metal film formed by a plating film including only copper. Here, "structure in which the first deposits 41 of copper are piled over one another" refers to a structure (porous structure) in which a large number of first deposits 41 (electrodeposits), which are formed from a plating metal of copper, are piled over one another in random directions such that a large number of pores are formed in the metal film (plating film). FIG. 2 illustrates a partial cross-sectional structure of the semiconductor device 10 in a state before the semiconductor element 50 is bonded to the wiring substrate 20.

The first roughened-surface copper metal film 40 of the first embodiment includes a structure in which the sheeted (thin plate-shaped) first deposits 41 of copper are piled over one another in various directions such that pores are formed between the sheeted first deposits 41. Each of the sheeted first deposits 41 may have a thickness, for example, in a range from 20 nm or greater to 100 nm or less. Preferably, each of the sheeted first deposits 41 has a thickness, for example, in a range from 20 nm or greater to 50 nm or less. The first roughened-surface copper metal film 40 has a structure including a stack of layers of a large number of sheeted first deposits 41. Further, the first roughened-surface copper metal film 40 has a three-dimensional nanostructure formed by a large number of first deposits 41, which are nanoscale microscopic sheets, intersecting one another in random directions and piled over one another in a multi-layer-like manner. Such a first roughened-surface copper metal film 40 is formed to have a structure in which the sheeted first deposits 41 are densely piled over one another such that a large number of pores are formed between the first deposits 41. The structure extends over the entire first roughened-surface copper metal film 40 in the thickness-wise direction of the first roughened-surface copper metal film 40. That is, the first roughened-surface copper metal film 40 includes a large number of microscopic pores throughout the first roughened-surface copper metal film 40 in the thickness-wise direction. The density of the first deposits 41 varies, for example, in the thickness-wise direction of the first roughened-surface copper metal film 40. In other words, the porosity of the first roughened-surface copper metal film 40 varies in the thickness-wise direction. For example, the density of the first deposits 41 increases toward the first opposing surface 31 in the thickness-wise direction of the first roughened-surface copper metal film 40. In other words, the porosity of the first roughened-surface copper metal film 40 decreases toward the first opposing surface 31. The overall porosity of the first roughened-surface copper metal film 40 may be, for example, in a range from 8% or greater to 20% or less.

In this manner, the first roughened-surface copper metal film 40 includes a structure in which a large number of first deposits 41 are piled over one another. Thus, the first roughened-surface copper metal film 40 has a roughened surface structure in which the surface is uneven and a large number of pores are included in the thickness-wise direction. The roughened surface structure of the first roughened-surface copper metal film 40 differs from a roughened surface structure formed through a typical roughening process, such as a roughening treatment using a chemical solution or a physical processing. Examples of the typical roughening process include blackening, etching, blasting, or the like.

Figure 17:
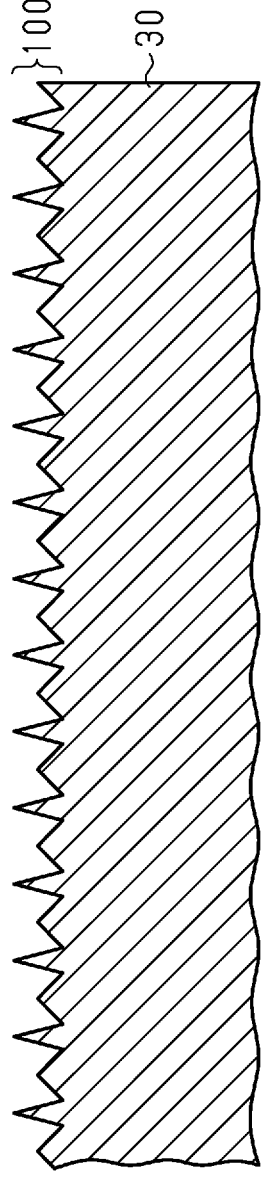
FIG. 17 is a schematic cross-sectional view illustrating a roughened surface structure of a comparative example.

A roughened surface structure 100 of a comparative example will now be described with reference to FIG. 17. As illustrated in FIG. 17, the roughened surface structure 100 is formed by performing a typical roughening process on the first connection terminal 30 to obtain a structure in which irregularities are formed only in the upper surface of the first connection terminal 30. The roughened surface structure 100 has a high density of copper deposits over the entire roughened surface structure 100 in the thickness-wise direction and the widthwise direction (direction orthogonal to thickness-wise direction). The roughened surface structure 100 does not include the structure in which the first deposits 41 are piled over one another such as that illustrated in FIG. 2, and pores are not included in the roughened surface structure 100 in the thickness-wise direction or inside the metal film. The porosity of the roughened surface structure 100 does not vary in the thickness-wise direction.

As illustrated in FIG. 2, the first roughened-surface copper metal film 40 is bonded to the first opposing surface 31 of the first connection terminal 30. No intermetallic compound is formed on the interface (bonding interface) between the first connection terminal 30 and the first roughened-surface copper metal film 40. Thus, the first connection terminal 30 of copper is directly bonded to the first roughened-surface copper metal film 40 of copper without another member formed from a material other than copper. The first roughened-surface copper metal film 40 is integrated with the first connection terminal 30. In the drawings, the first roughened-surface copper metal film 40 is distinguished from the first connection terminal 30 by a solid line to facilitate understanding. Actually, there may be no interface between the first connection terminal 30 and the first roughened-surface copper metal film 40 and the boundary may be unclear.

Semiconductor Element 50

As illustrated in FIG. 1, the semiconductor element 50 includes a plurality of second connection terminals 60 and a second roughened-surface copper metal film 70. The second connection terminals 60 are formed on a circuit formation surface (here, lower surface) of the semiconductor element 50. The semiconductor element 50 is flip-chip mounted on the wiring substrate 20. The second connection terminals 60 of the semiconductor element 50 are electrically connected to the corresponding first connection terminals 30 of the wiring substrate 20. The second connection terminals 60 are electrically connected to the first connection terminal 30 via the second roughened-surface copper metal film 70 and the first roughened-surface copper metal film 40. This electrically connects the semiconductor element 50 to the first connection terminals 30 via the second connection terminals 60, the second roughened-surface copper metal film 70, and the first roughened-surface copper metal film 40.

The semiconductor element 50 may be, for example, a logic chip such as a central processing unit (CPU) chip or a graphics processing unit (GPU) chip. Further, the semiconductor element 50 may be, for example, a memory chip such as a dynamic random-access memory (DRAM) chip, a static random-access memory (SRAM) chip, or a flash memory. Multiple semiconductor elements 50 including a combination of logic chips and memory chips may be mounted on the wiring substrate 20.

Second Connection Terminal 60

The second connection terminals 60 are arranged to face the first connection terminals 30, respectively. Each second connection terminal 60 has the form of, for example, a rod projecting downward from the circuit formation surface of the semiconductor element 50. The second connection terminal 60 is, for example, a metal post. In the example illustrated in FIG. 1, the second connection terminal 60 is cylindrical. The second connection terminal 60 may have any planar shape and any size. The second connection terminal 60 may have a circular planar shape in which the diameter is, for example, in a range from 15 μm or greater to 40 μm or less. The second connection terminal 60 may have a thickness, for example, in a range from 2 μm or greater to 50 μm or less.

The material of the second connection terminal 60 may be, for example, copper or a copper alloy. In the example illustrated in FIG. 1, the second connection terminal 60 is formed from copper. The second connection terminal 60 may be an electroless plating layer or an electrolytic plating layer.

The second connection terminal 60 includes a second opposing surface 61 (here, lower surface) facing the first opposing surface 31 of the first connection terminal 30. The second opposing surface 61 of the second connection terminal 60 is, for example, a flat surface. The second opposing surface 61 extends parallel to, for example, the circuit formation surface of the semiconductor element 50. The second opposing surface 61 is, for example, a rather even smooth surface.

Second Roughened-Surface Copper Metal Film 70

The second roughened-surface copper metal film 70 is formed on the second opposing surface 61 of each second connection terminal 60. The second roughened-surface copper metal film 70, for example, entirely covers the second opposing surface 61. The second roughened-surface copper metal film 70 exposes, for example, the side surface of the second connection terminal 60. In other words, in the example illustrated in FIG. 1, the second roughened-surface copper metal film 70 covers only the second opposing surface 61 among all of the surfaces of the second connection terminal 60. The second roughened-surface copper metal film 70 may have a thickness (film thickness), for example, in a range from 2 μm or greater to 5 μm or less.

As illustrated in FIG. 2, the second roughened-surface copper metal film 70 includes the same structure as the first roughened-surface copper metal film 40. The second roughened-surface copper metal film 70 is a plating film in which a surface (both lower and side surfaces or only lower surface) is roughened. The surface (roughened surface) of the second roughened-surface copper metal film 70 has microscopic irregularities. The second roughened-surface copper metal film 70 includes a structure in which second deposits 71 of copper are piled over one another on the second opposing surface 61 of the second connection terminal 60. The second deposits 71 may be flat bodies formed from copper. The second roughened-surface copper metal film 70 is a plating film formed in an electrolytic copper plating process. The second roughened-surface copper metal film 70 is, for example, a metal film formed by a plating film including only copper. Here, "structure in which the second deposits 71 of copper are piled over one another" refers to a structure (porous structure) in which a large number of second deposits 71 (electrodeposits), which are formed from a plating metal of copper, are piled over one another in random directions such that a large number of pores are formed in the plating film.

The second roughened-surface copper metal film 70 of the first embodiment includes a structure in which the sheeted (thin plate-shaped) second deposits 71 of copper are piled over one another in various directions such that pores are formed between the sheeted second deposits 71. Each of the sheeted second deposits 71 may have a thickness, for example, in a range from 20 nm or greater to 100 nm or less. Preferably, each of the sheeted second deposits 71 has a thickness, for example, in a range from 20 nm or greater to 50 nm or less. The second roughened-surface copper metal film 70 has a structure including a stack of layers of a large number of sheeted second deposits 71. The second roughened-surface copper metal film 70 is formed to have a structure in which the sheeted second deposits 71 are densely piled over one another such that a large number of pores are formed between the second deposits 71. The structure extends over the entire second roughened-surface copper metal film 70 in the thickness-wise direction of the second roughened-surface copper metal film 70. The second roughened-surface copper metal film 70 has a three-dimensional nanostructure formed by a large number of second deposits 71, which are nanoscale microscopic sheets, intersecting one another in random directions and piled over one another in a multi-layer-like manner. Such a second roughened-surface copper metal film 70 includes a large number of microscopic pores throughout the second roughened-surface copper metal film 70 in the thickness-wise direction. The density of the second deposits 71 varies, for example, in the thickness-wise direction of the second roughened-surface copper metal film 70. In other words, the porosity of the second roughened-surface copper metal film 70 varies in the thickness-wise direction. For example, the density of the second deposits 71 increases toward the second opposing surface 61 in the thickness-wise direction of the second roughened-surface copper metal film 70. In other words, the porosity of the second roughened-surface copper metal film 70 decreases toward the second opposing surface 61. The overall porosity of the second roughened-surface copper metal film 70 may be, for example, in a range from 8% or greater to 20% or less.

In this manner, the second roughened-surface copper metal film 70 includes a structure in which a large number of second deposits 71 are piled over one another. Thus, the second roughened-surface copper metal film 70 has a roughened surface structure in which the surface is uneven and a large number of pores are included in the thickness-wise direction.

The second roughened-surface copper metal film 70 is bonded to the second opposing surface 61 of the second connection terminal 60. No intermetallic compound is formed on the interface (bonding interface) between the second connection terminal 60 and the second roughened-surface copper metal film 70. Thus, the second connection terminal 60 of copper is directly bonded to the second roughened-surface copper metal film 70 of copper without another member formed from a material other than copper. The second roughened-surface copper metal film 70 is integrated with the second connection terminal 60. In the drawings, the second roughened-surface copper metal film 70 is distinguished from the second connection terminal 60 by a solid line to facilitate understanding. Actually, there may be no interface between the second connection terminal 60 and the second roughened-surface copper metal film 70 and the boundary may be unclear.

Figure 3:
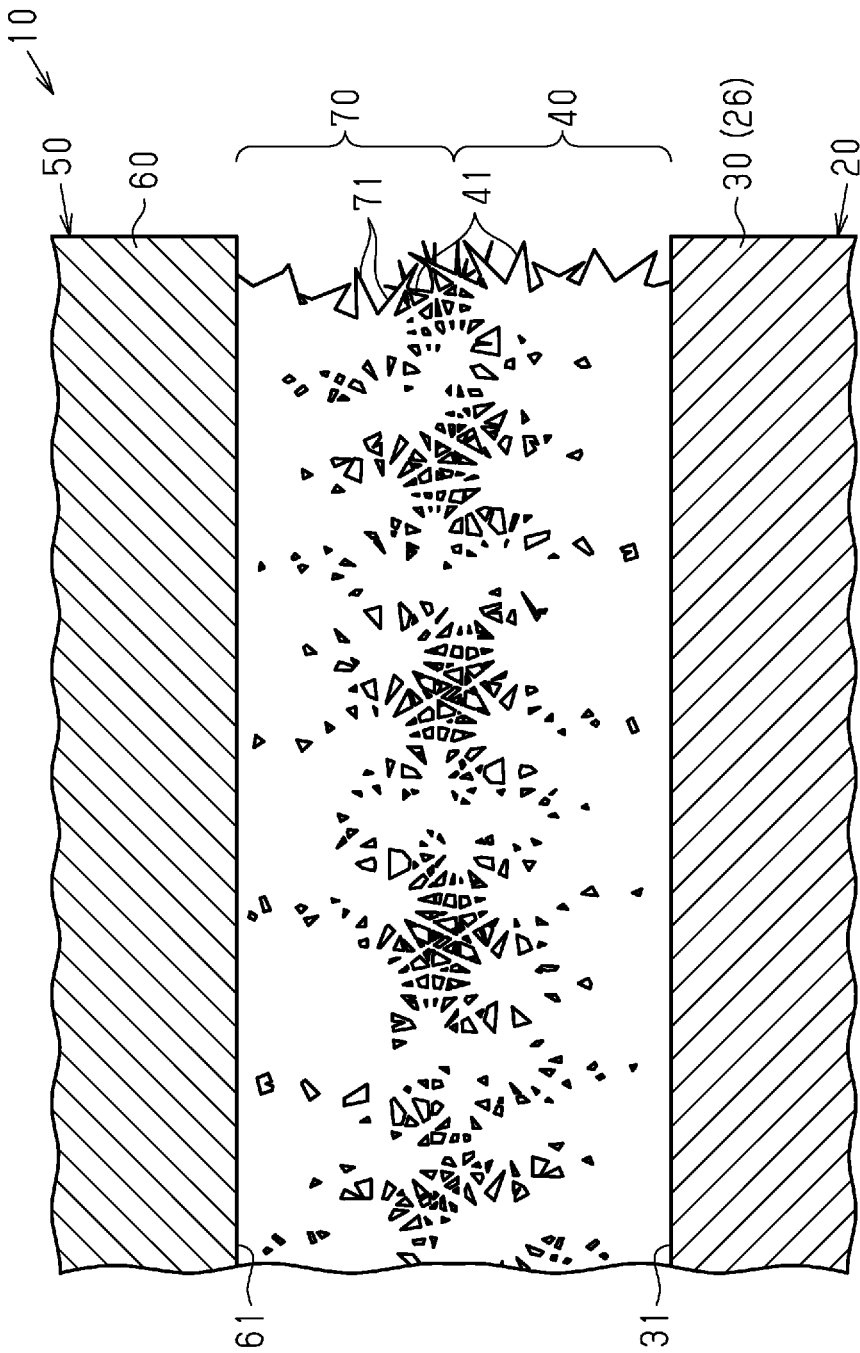
FIG. 3 is a schematic cross-sectional view illustrating part of the semiconductor device in FIG. 1.

As illustrated in FIG. 3, the second roughened-surface copper metal film 70 is bonded to the first roughened-surface copper metal film 40. The second roughened-surface copper metal film 70 is, for example, sintered and diffusion-bonded to the first roughened-surface copper metal film 40. No intermetallic compound is formed on the interface (bonding interface) between the first roughened-surface copper metal film 40 and the second roughened-surface copper metal film 70. Thus, the first roughened-surface copper metal film 40 of copper is directly bonded to the second roughened-surface copper metal film 70 of copper without another member formed from a material other than copper.

A bonded portion of the first roughened-surface copper metal film 40 and the second roughened-surface copper metal film 70 includes a structure in which the first deposits 41 and the second deposits 71 are piled. For example, in the bonded portion of the first roughened-surface copper metal film 40 and the second roughened-surface copper metal film 70, the first deposits 41 are sintered and diffusion-bonded to the second deposits 71. Thus, the first deposits 41 are integrated with the second deposits 71, and the first roughened-surface copper metal film 40 is integrated with the second roughened-surface copper metal film 70. The bonded portion of the first roughened-surface copper metal film 40 and the second roughened-surface copper metal film 70 has a structure in which the first deposits 41 are diffusion-bonded to the second deposits 71 in a state including pores. The porosity of the bonded portion of the first roughened-surface copper metal film 40 and the second roughened-surface copper metal film 70 may be, for example, in a range from 5% or greater to 18% or less. The porosity of the bonded portion of the first roughened-surface copper metal film 40 and the second roughened-surface copper metal film 70 is greater than the porosity inside the first roughened-surface copper metal film 40 and the porosity inside the second roughened-surface copper metal film 70. Here, the porosity inside the first roughened-surface copper metal film 40 may correspond to a porosity of the first roughened-surface copper metal film 40 except the bonded portion. The porosity inside the second roughened-surface copper metal film 70 may correspond to a porosity of the second roughened-surface copper metal film 70 except the bonded portion. In other words, the bonded portion of the first roughened-surface copper metal film 40 and the second roughened-surface copper metal film 70 has the highest porosity among the first roughened-surface copper metal film 40, the second roughened-surface copper metal film 70, and the bonded portion of the first roughened-surface copper metal film 40 and the second roughened-surface copper metal film 70. The porosity of the first roughened-surface copper metal film 40 decreases from the bonded portion of the first roughened-surface copper metal film 40 and the second roughened-surface copper metal film 70 toward the first opposing surface 31 in the thickness-wise direction of the first roughened-surface copper metal film 40. Also, the porosity of the second roughened-surface copper metal film 70 decreases from the bonded portion of the first roughened-surface copper metal film 40 and the second roughened-surface copper metal film 70 toward the second opposing surface 61 in the thickness-wise direction of the second roughened-surface copper metal film 70.

The bonded portion of the first roughened-surface copper metal film 40 and the second roughened-surface copper metal film 70 does not project outward from, for example, the side surface of the first connection terminal 30 or the side surface of the second connection terminal 60. In other words, the bonded portion of the first roughened-surface copper metal film 40 and the second roughened-surface copper metal film 70 does not include a surplus bonding metal member (solder or the like) projecting outward from the side surface of the first connection terminal 30 or the side surface of the second connection terminal 60 in a planar direction (left-right direction in FIG. 3). The planar direction refers to, for example, a direction orthogonal to the thickness-wise direction of the first roughened-surface copper metal film 40 as viewed in a cross section. The first roughened-surface copper metal film 40 and the second roughened-surface copper metal film 70 allow the first connection terminal 30 to be bonded perpendicular to the second connection terminal 60.

A connection structural body is formed by the first connection terminals 30, the first roughened-surface copper metal film 40, the second connection terminals 60, and the second roughened-surface copper metal film 70.

External Connection Terminal 80

As illustrated in FIG. 1, the external connection terminals 80 are formed on the external connection pads P1 of the wiring substrate 20. The external connection terminals 80 are, for example, connection terminals for electrical connection with pads arranged on a mounting board such as a motherboard (not illustrated) or the like. The external connection terminals 80 may each be, for example, a solder ball or a lead pin. In the first embodiment, a solder ball is used as the external connection terminal 80.

Method for Manufacturing Semiconductor Device 10

A method for manufacturing the semiconductor device 10 will now be described with reference to FIGS. 4 to 6. The method for manufacturing the connection structural body will be described in detail. To facilitate understanding, elements of the semiconductor device 10 are denoted by the same reference numerals throughout the different stages of manufacturing in the drawings.

Figure 4:
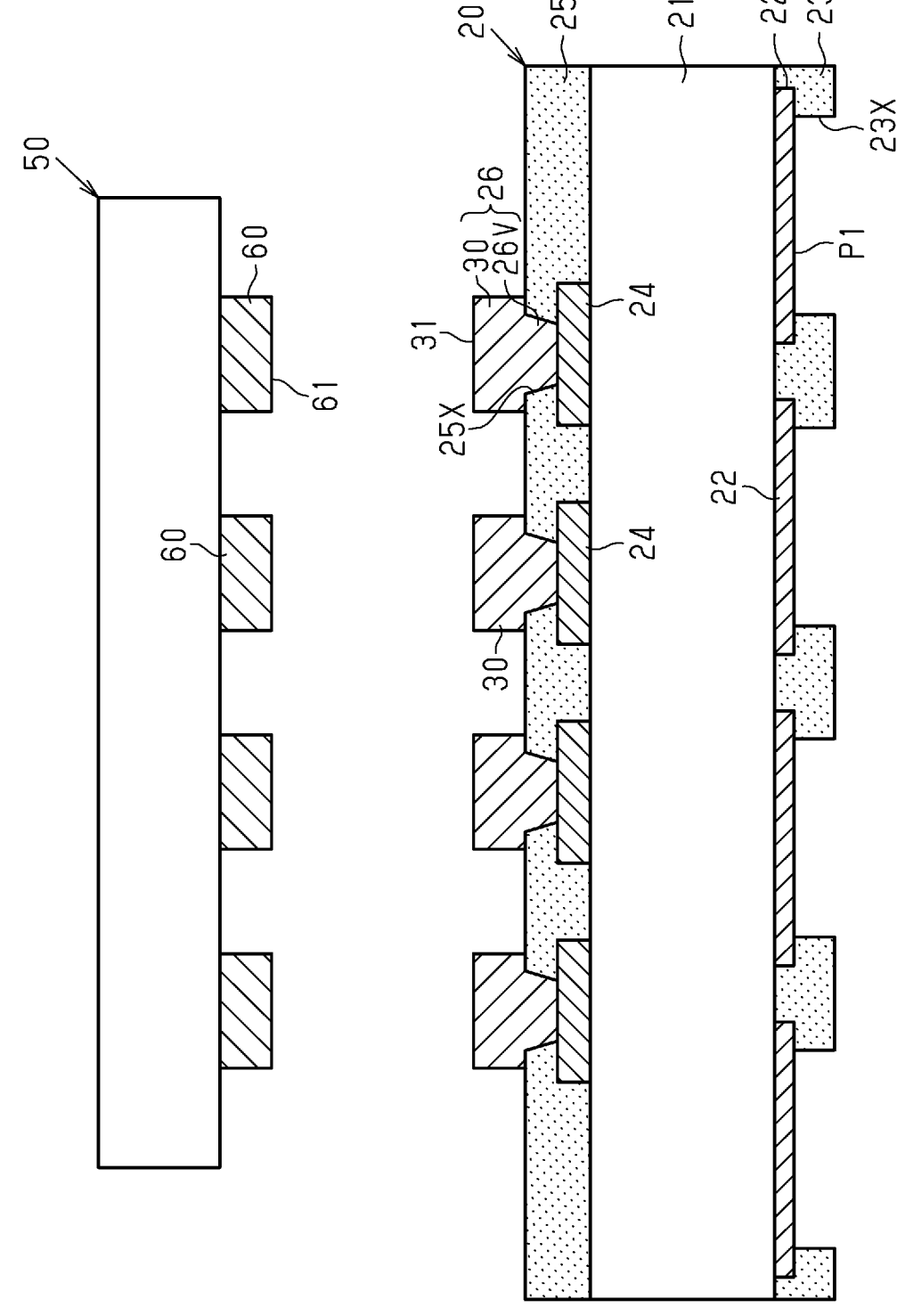
FIGS. 4, 5, and 6 are schematic cross-sectional views illustrating a method for manufacturing the semiconductor device in FIG. 1.

As illustrated in FIG. 4, first, the wiring substrate 20 is prepared by forming the wiring layer 22 and the solder resist layer 23 on the lower surface of the substrate body 21. Further, the wiring layer 24, the insulating layer 25, and the wiring layer 26 are formed on the upper surface of the substrate body 21. The wiring substrate 20 may be manufactured through a known manufacturing process, which will not be described in detail. The wiring layer 26 including the via wiring 26V and the first connection terminal 30 may be formed through, for example, a semi-additive process. For example, first, a seed layer (not illustrated) is formed to cover the inner wall of each open portion 25X, the upper surface of the wiring layer 24 exposed at the bottom of each open portion 25X, and the upper surface of the insulating layer 25. Then, a resist pattern (not illustrated) including open portions corresponding to the first connection terminals 30 is formed on the seed layer. An electrolytic copper plating process is performed using the resist pattern as a plating mask to form the via wiring 26V and the first connection terminals 30. Further, in the step illustrated in FIG. 4, the semiconductor element 50 is prepared with the second connection terminals 60 formed on the circuit formation surface.

Subsequently, in the step illustrated in FIG. 5, the first roughened-surface copper metal film 40 is formed on the first opposing surface 31 of each first connection terminal 30 of the wiring layer 26. The first roughened-surface copper metal film 40 may be formed through an electrolytic copper plating process. The first roughened-surface copper metal film 40 may be formed through, for example, an electrolytic copper plating process in which an electrolytic copper plating bath including a surface roughening agent (additive agent) is used as a plating bath, and the first connection terminals 30 and the like are used as a plating power feeding layer. In this electrolytic copper plating step, for example, a plating mask may be the resist pattern (not illustrated) used for forming the wiring layer 26. Also, the surface roughening agent added to the electrolytic copper plating bath may be polyacrylic acid. In the present step, the composition of the plating bath, current density, and current amount used in the electrolytic copper plating process are appropriately adjusted so that the first roughened-surface copper metal film 40 has a desired roughened surface structure, or a structure in which the first deposits 41 of copper are piled over one another (refer to FIG. 2). An example of a plating condition for forming the first roughened-surface copper metal film 40 will now be described. When using an electrolytic copper plating bath including polyacrylic acid, the composition of the plating bath and an electrodeposition condition are set as follows.

First Plating Condition (1) Plating Bath Composition

Base bath:

CuSO$_4$·5H$_2$O: 0.85 M

H$_2$SO$_4$: 0.55 M

Additive agent:

Polyacrylic acid (molecular weight 5000): $3.0 \times 10^{-4}$ M (2) Electrodeposition Condition Current mode: Current regulation method Current amount: 4 Ccm$^{-2}$ Current density: 1 Adm$^{-2}$ Temperature: Room temperature Agitation: No Anode: Cu plate Cathode: Plating subject (wiring substrate or semiconductor element)

As described above, the composition of the plating bath and the electrodeposition condition are appropriately adjusted so that the first roughened-surface copper metal film 40 has a desired roughened surface structure.

Figure 7:
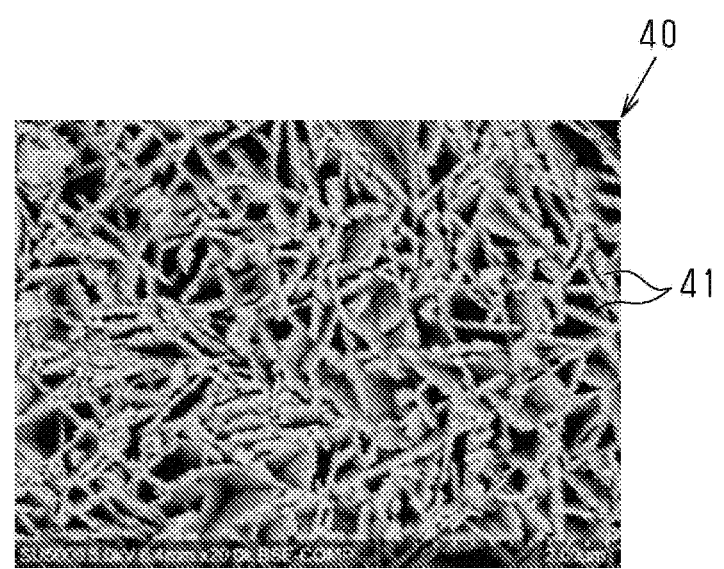
FIG. 7 is a scanning electron microscope (SEM) micrograph observing the surface of a first roughened-surface copper metal film in accordance with the first embodiment from above.

FIG. 7 is a scanning electron microscope (SEM) micrograph observing the surface of the first roughened-surface copper metal film 40 from above. The first roughened-surface copper metal film 40 is formed by the electrolytic copper plating process performed under the above-described first plating condition. The SEM image of FIG. 7 illustrates that the first roughened-surface copper metal film 40 has a roughened surface structure in which a large number of sheeted (thin plate-shaped or plate-shaped) first deposits 41 are piled over one another in random directions such that a large number of pores are formed between the first deposits 41. In other words, the SEM image of FIG. 7 illustrates that when the electrolytic copper plating process is performed under the above-described first plating condition, the first roughened-surface copper metal film 40 has a desired roughened surface structure. The first deposits 41 in the SEM image of FIG. 7 have a thickness in a range from 20 nm or greater to 100 nm or less.

The above-described plating condition (plating bath composition and electrodeposition condition) is merely an example and not particularly limited as long as the condition is adjusted so that the first roughened-surface copper metal film 40 has a desired roughened surface structure. The shape and the density of the first deposits 41 in the first roughened-surface copper metal film 40 may be controlled by adjusting the concentration of polyacrylic acid, the current density, the current amount, the temperature of the plating bath, and the like in the electrolytic copper plating process.

Figure 5:
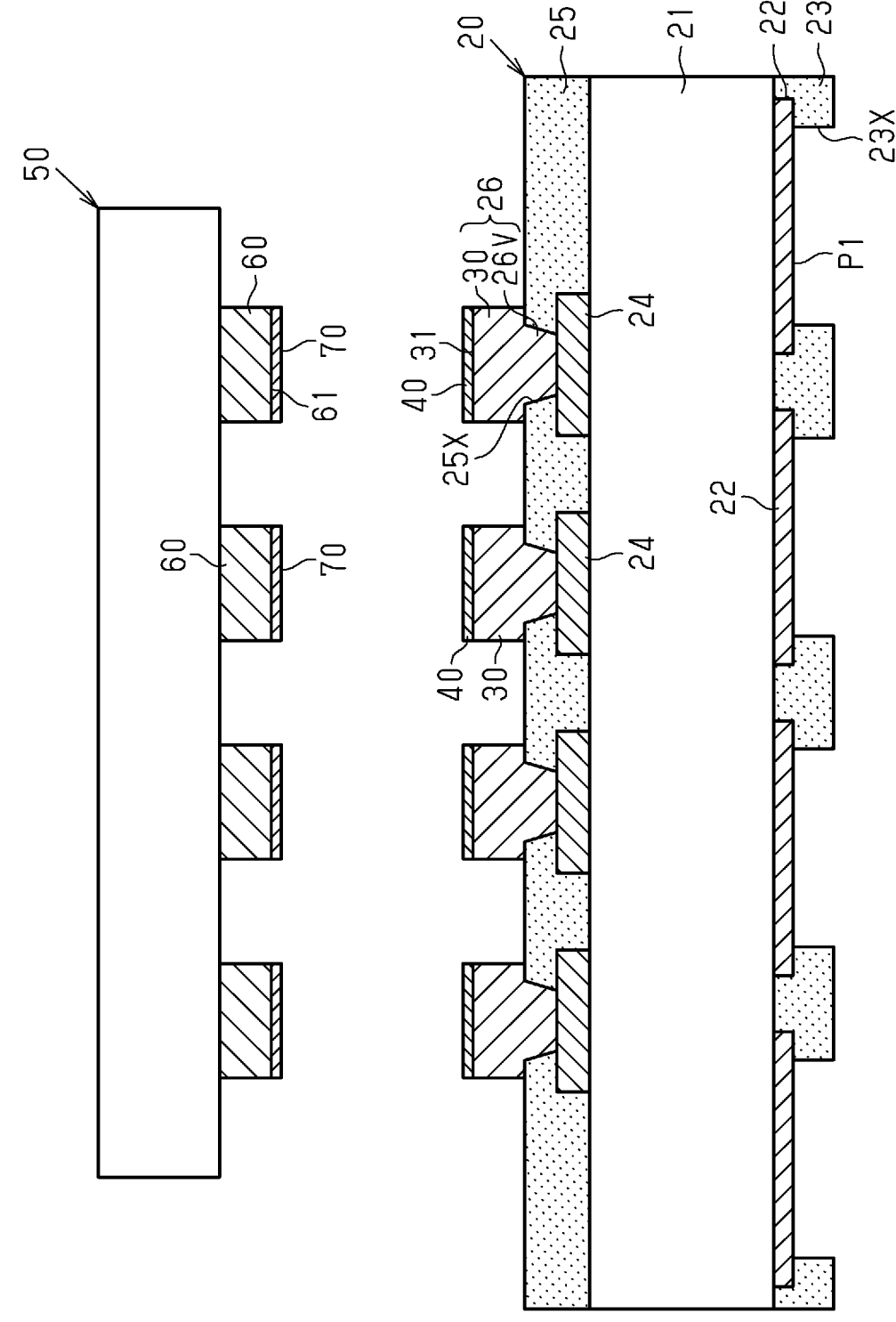

Further, in the step illustrated in FIG. 5, the second roughened-surface copper metal film 70 is formed on the second opposing surface 61 of the second connection terminal 60. In the same manner in which the first roughened-surface copper metal film 40 is formed, the second roughened-surface copper metal film 70 may be formed by an electrolytic copper plating process that uses an electrolytic copper plating bath to which polyacrylic acid is added. For example, the plating condition for this electrolytic copper plating step may be set to the same condition as the first plating condition for forming the first roughened-surface copper metal film 40. The second roughened-surface copper metal film 70 formed by such an electrolytic copper plating process has the same roughened surface structure illustrated by the SEM image of FIG. 7.

Figure 6:
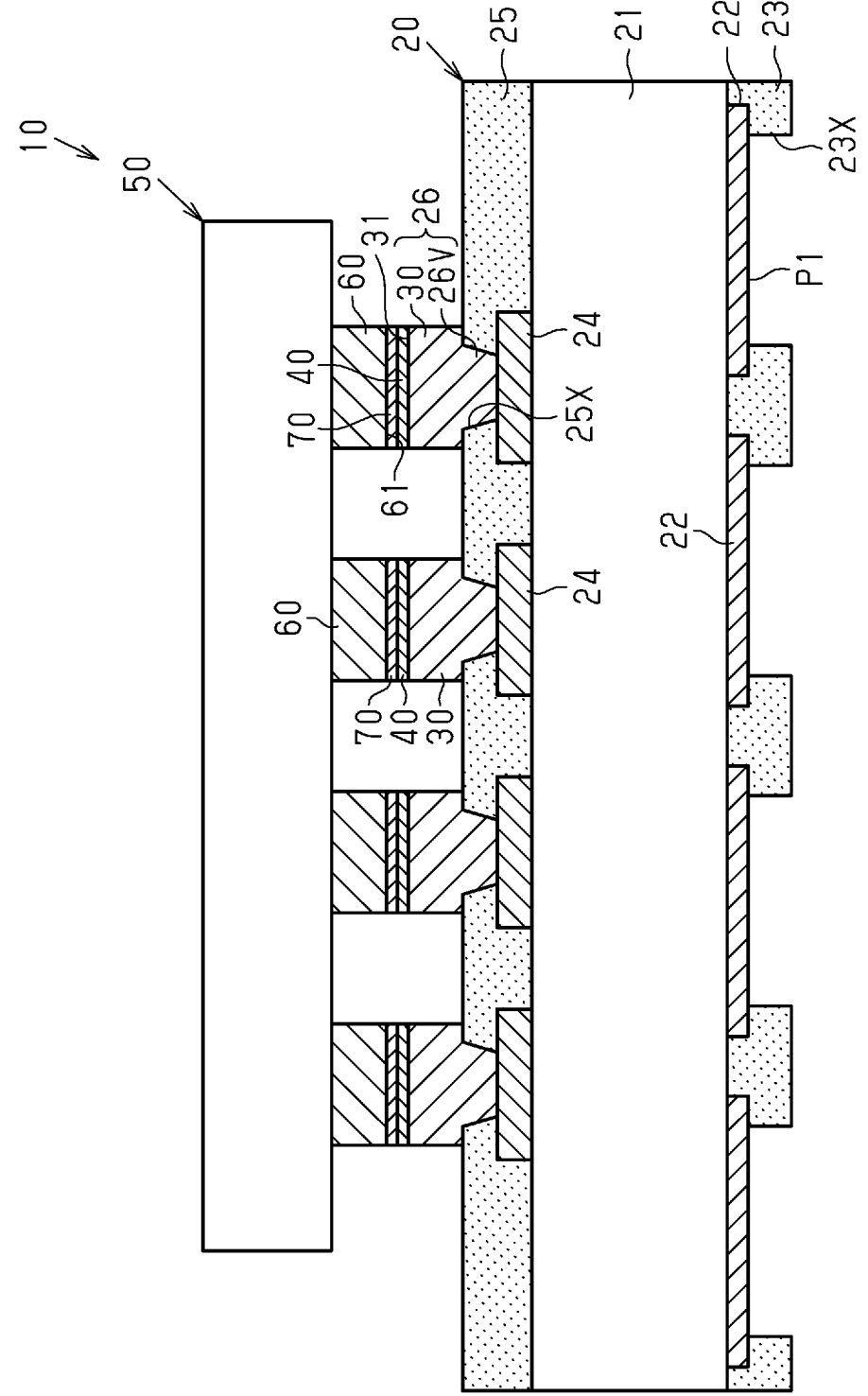

In the step illustrated in FIG. 6, the semiconductor element 50 including the second connection terminals 60 and the second roughened-surface copper metal film 70 is arranged above the wiring substrate 20. In this case, the wiring substrate 20 and the semiconductor element 50 are arranged such that the first connection terminals 30 face the second connection terminals 60. Then, the second roughened-surface copper metal film 70 is placed on the first roughened-surface copper metal film 40.

Subsequently, the first roughened-surface copper metal film 40 is bonded to the second roughened-surface copper metal film 70. For example, the first roughened-surface copper metal film 40 is sintered and diffusion-bonded to the second roughened-surface copper metal film 70. In this step, bonding is performed by applying heat and pressure to the wiring substrate 20 and the semiconductor element 50 in a state in which the second roughened-surface copper metal film 70 is arranged on the first roughened-surface copper metal film 40. The heating temperature may be, for example, in a range from 180° C. or higher to 250° C. or lower. The pressure may be, for example, in a range from 8 MPa or greater to 15 MPa or less. The processing time of the heating and pressing process may be, for example, in a range from three minutes or longer to ten minutes or shorter. The heating and pressing process may be performed in the atmosphere. In such a heating and pressing process, the first roughened-surface copper metal film 40 is sintered and diffusion-bonded to the second roughened-surface copper metal film 70. As illustrated in FIG. 3, when the first deposits 41 of the first roughened-surface copper metal film 40 are sintered and diffusion-bonded to the second deposits 71 of the second roughened-surface copper metal film 70, the first deposits 41 are integrated with the second deposits 71. This bonds and integrates the first roughened-surface copper metal film 40 and the second roughened-surface copper metal film 70.

Figure 8:
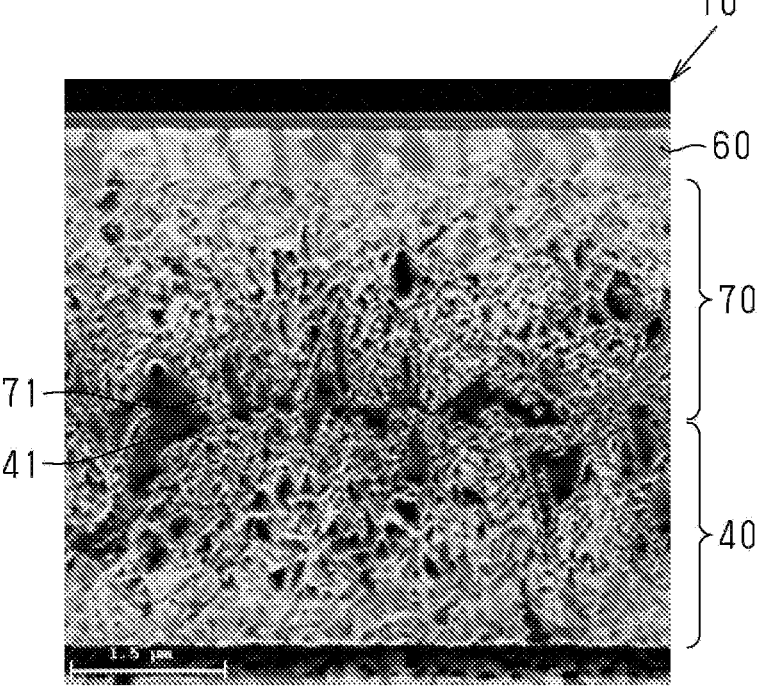
FIG. 8 is a scanning ion microscope (SIM) micrograph observing a cross-sectional structure of a connection structural body in accordance with the first embodiment.

FIG. 8 is a scanning ion microscope (SIM) micrograph observing the cross-sectional structure of the bonded portion when the first roughened-surface copper metal film 40 is bonded to the second roughened-surface copper metal film 70 in the heating and pressing process in which the heating temperature is set to 200° C., the pressure is set to 10 MPa, and the processing time is set to five minutes. The SIM image of FIG. 8 illustrates that the first deposits 41 are bonded to the second deposits 71 in a state in which pores are included in the bonded portion of the first roughened-surface copper metal film 40 and the second roughened-surface copper metal film 70. When the first deposits 41 are bonded to the second deposits 71, the first roughened-surface copper metal film 40 is bonded to and integrated with the second roughened-surface copper metal film 70. Accordingly, from the SIM image of FIG. 8, it may be confirmed that the first roughened-surface copper metal film 40 was bonded to the second roughened-surface copper metal film 70 in a heating and pressing process in which the heating temperature is set to 200° C., the pressure is set to 10 MPa, and the processing time is set to five minutes. That is, the first roughened-surface copper metal film 40 is bonded to the second roughened-surface copper metal film 70 at a relatively low temperature (approximately 200° C.). This is because the first roughened-surface copper metal film 40 and the second roughened-surface copper metal film 70 are both formed by nanoscale microscopic deposits, namely, sheeted first deposits 41 and sheeted second deposits 71 each having a thickness of a few dozen nanometers. The nanoscale first deposits 41 and second deposits 71 have a high surface reactivity. Thus, diffusion progresses on the particle interfaces and allows sintering to take place even at a temperature lower than the actual melting point. Therefore, the first deposits 41 and the second deposits 71 are sintered at a relatively low temperature.

A roughened surface structure obtained by a typical roughening treatment, or the roughened surface structure 100 illustrated in FIG. 17, only includes the uneven upper surface and does not include nanoscale metal particles or a structure in which deposits are piled over one another. Accordingly, even if the heating and pressing process is performed under the above-described condition in a state in which two roughened surface structures 100 are placed one upon the other, the two roughened surface structures 100 will not be bonded to each other. The present inventors conducted an experiment in which two roughened surface structures 100 were placed one upon the other and heated at approximately 250° C. for ten minutes while applying pressure of 15 MPa. The inventors confirmed that the two roughened surface structures 100 were not bonded to each other.

Figure 18:
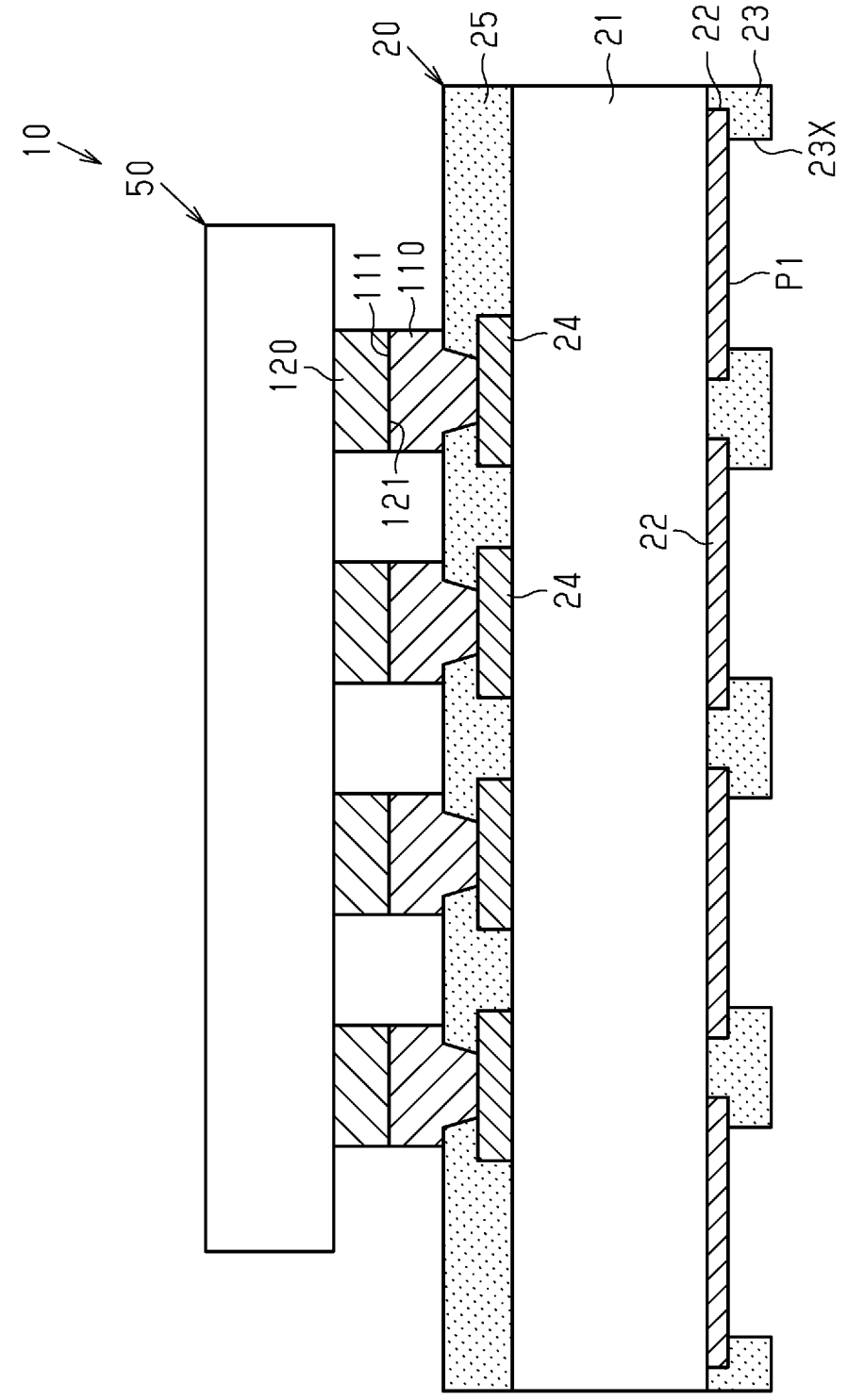
FIG. 18 is a schematic cross-sectional view illustrating a semiconductor device of another comparative example.

A diffusion-bonded structure of another comparative example will now be described with reference to FIG. 18. To facilitate understanding, the same reference numerals are given to the components that are the same as the corresponding components in FIG. 1. As illustrated in FIG. 18, copper connection terminals 110 each having a smooth surface 111 and copper connection terminals 120 each having a smooth surface 121 undergo a heating and pressing process to diffusion-bond the smooth surfaces 111 and 121. However, in order to diffusion-bond the smooth surfaces 111 and 121, the smooth surfaces 111 and 121 need to be placed one upon the other and heated to a high temperature such as approximately 500° C. to 900° C. Thus, if the smooth surfaces 111 and 121 were to be diffusion-bonded when mounting the semiconductor element 50 to the wiring substrate 20, the semiconductor element 50 would be exposed to a high temperature of greater than or equal to 500° C.

In contrast, the step of bonding the first roughened-surface copper metal film 40 and the second roughened-surface copper metal film 70 illustrated in FIG. 6 (that is, FIG. 1) may be performed at a temperature of approximately 200° C., which is lower than the heating temperature at which the smooth surfaces 111 and 121 (refer to FIG. 18) are bonded. Thus, the semiconductor element 50 may be mounted on the wiring substrate 20 at a lower temperature and will not be exposed to such a high temperature. This reduces the heat stress on the semiconductor element 50.

A plasma treatment may be performed on the surface of the first roughened-surface copper metal film 40 and the surface of the second roughened-surface copper metal film 70 before the step of bonding the first roughened-surface copper metal film 40 and the second roughened-surface copper metal film 70. In this case, even if an oxide film forms on the surface of the first roughened-surface copper metal film 40 and the surface of the second roughened-surface copper metal film 70, the plasma treatment will remove the oxide film. This improves sintering of the first roughened-surface copper metal film 40 and the second roughened-surface copper metal film 70.

The semiconductor element 50 is mounted on the wiring substrate 20 through the steps described above. Subsequently, the external connection terminals 80 illustrated in FIG. 1 are formed on the external connection pads P1. This manufactures the semiconductor device 10 illustrated in FIG. 1.

The first embodiment has the advantages described as below.

(1) The first roughened-surface copper metal film 40 is formed on the first opposing surfaces 31 of the first connection terminals 30, and the second roughened-surface copper metal film 70 is formed on the second opposing surfaces 61 of the second connection terminals 60. Then, the first roughened-surface copper metal film 40 is bonded to the second roughened-surface copper metal film 70. With this structure, in which the first roughened-surface copper metal film 40 is bonded to the second roughened-surface copper metal film 70, the first connection terminal 30 is bonded to the second connection terminal 60 via the second roughened-surface copper metal film 70 and the first roughened-surface copper metal film 40. In other words, the first roughened-surface copper metal film 40 and the second roughened-surface copper metal film 70 bond the first connection terminals 30 to the second connection terminals 60. The first roughened-surface copper metal film 40 and the second roughened-surface copper metal film 70 do not expand in a planar direction like a solder layer. Accordingly, the bonded portion does not expand in a planar direction like a solder layer that bonds the first connection terminal 30 and the second connection terminal 60. As a result, even when the pitch of the first connection terminals 30 is narrowed, short-circuiting is less likely to occur between adjacent first connection terminals 30. This allows the first connection terminals 30 to have a narrow pitch.

(2) The first roughened-surface copper metal film 40 and the second roughened-surface copper metal film 70 are both formed from copper. Thus, a bonded portion of the first connection terminal 30 and the second connection terminal 60 may be formed by copper. This reduces electric resistance in the bonded portion of the first connection terminal 30 and the second connection terminal 60 as compared to when a solder layer bonds the first connection terminal 30 and the second connection terminal 60.

(3) The bonded portion of the first roughened-surface copper metal film 40 and the second roughened-surface copper metal film 70 includes a structure in which the first deposits 41 and the second deposits 71 are piled. The bonded portion of the first roughened-surface copper metal film 40 and the second roughened-surface copper metal film 70 includes a structure in which the first deposits 41 are bonded to the second deposits 71 in a state pores are included. With this structure, in which pores are included in the bonded portion of the first roughened-surface copper metal film 40 and the second roughened-surface copper metal film 70, the first deposits 41 and the second deposits 71 are easily deformed in the bonded portion. This reduces the stress applied to the bonded portion of the first roughened-surface copper metal film 40 and the second roughened-surface copper metal film 70. Accordingly, cracking or the like that would be caused by stress is limited in the bonded portion of the first roughened-surface copper metal film 40 and the second roughened-surface copper metal film 70. As a result, the connection reliability is improved between the first roughened-surface copper metal film 40 and the second roughened-surface copper metal film 70.

(4) The first roughened-surface copper metal film 40 includes a structure in which the sheeted first deposits 41, having a thickness of a few dozen nanometers, are piled over one another on the first opposing surface 31 such that pores are formed between the sheeted first deposits 41. The second roughened-surface copper metal film 70 includes a structure in which the sheeted second deposits 71, having a thickness of a few dozen nanometers, are piled over one another on the second opposing surface 61 such that pores are formed between the sheeted second deposits 71. Thus, the first roughened-surface copper metal film 40 and the second roughened-surface copper metal film 70 are both formed from a large number of nanoscale metal particles. This enhances the surface reactivity of the first deposits 41 and the second deposits 71 and improves sintering of the first deposits 41 and the second deposits 71. This allows the first deposits 41 and the second deposits 71 to be sintered at a relatively low temperature. As a result, the temperature may be lowered when bonding the first roughened-surface copper metal film 40 to the second roughened-surface copper metal film 70, that is, when mounting the semiconductor element 50 on the wiring substrate 20. In this case, the semiconductor element 50 is not exposed to a high temperature, and heat stress on the semiconductor element 50 is thus reduced.

(5) The first connection terminal 30 is formed from copper, and the second connection terminal 60 is formed from copper. With this structure, the first connection terminal 30, the first roughened-surface copper metal film 40, the second connection terminal 60, and the second roughened-surface copper metal film 70 are all formed from copper. Thus, the first connection terminal 30, the first roughened-surface copper metal film 40, the second connection terminal 60, and the second roughened-surface copper metal film 70 are connected by a single metal, that is, copper. Accordingly, no intermetallic compound is formed on any interface between the first connection terminal 30, the first roughened-surface copper metal film 40, the second connection terminal 60, and the second roughened-surface copper metal film 70. This limits formation of a Kirkendall void caused by formation of an intermetallic compound. This also limits breakage and the like caused by Kirkendall voids. Thus, the connection reliability is improved between the first connection terminal 30 and the second connection terminal 60. Consequently, the reliability for mounting the semiconductor element 50 is improved.

Second Embodiment

Figure 9:
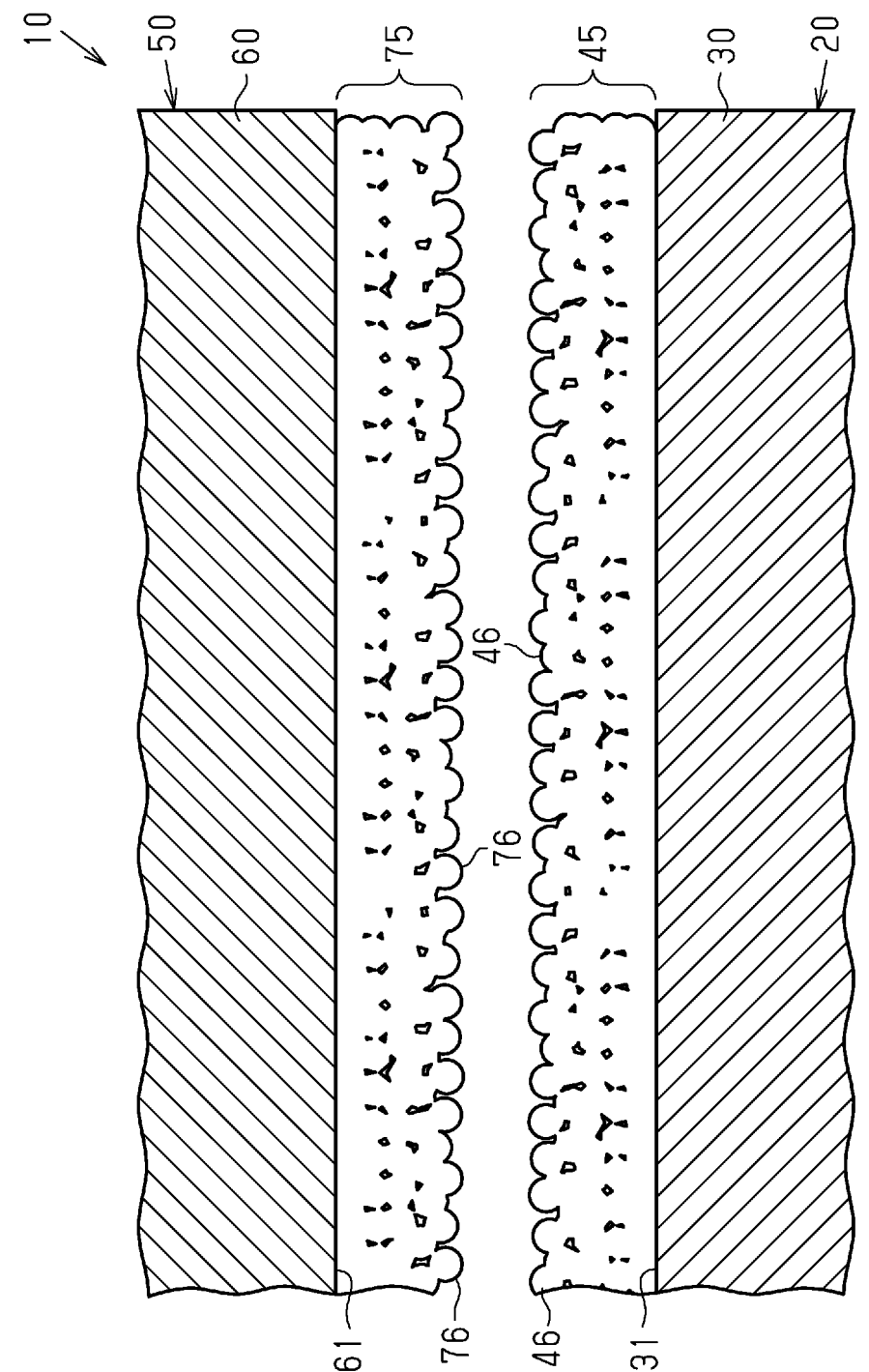
FIG. 9 is a schematic exploded cross-sectional view illustrating part of a semiconductor device in accordance with a second embodiment.

A second embodiment will now be described with reference to FIGS. 9 to 12. The semiconductor device 10 of the second embodiment differs from that of the first embodiment in the roughened surface structure. Hereafter, the difference from the first embodiment will be mainly described. The same reference numerals are given to those components that are the same as the corresponding components illustrated in FIGS. 1 to 8. Such elements will not be described in detail. FIG. 9 illustrates a cross-sectional structure of a connection structural body in a state before the semiconductor element 50 is mounted on the wiring substrate 20.

Figure 10:
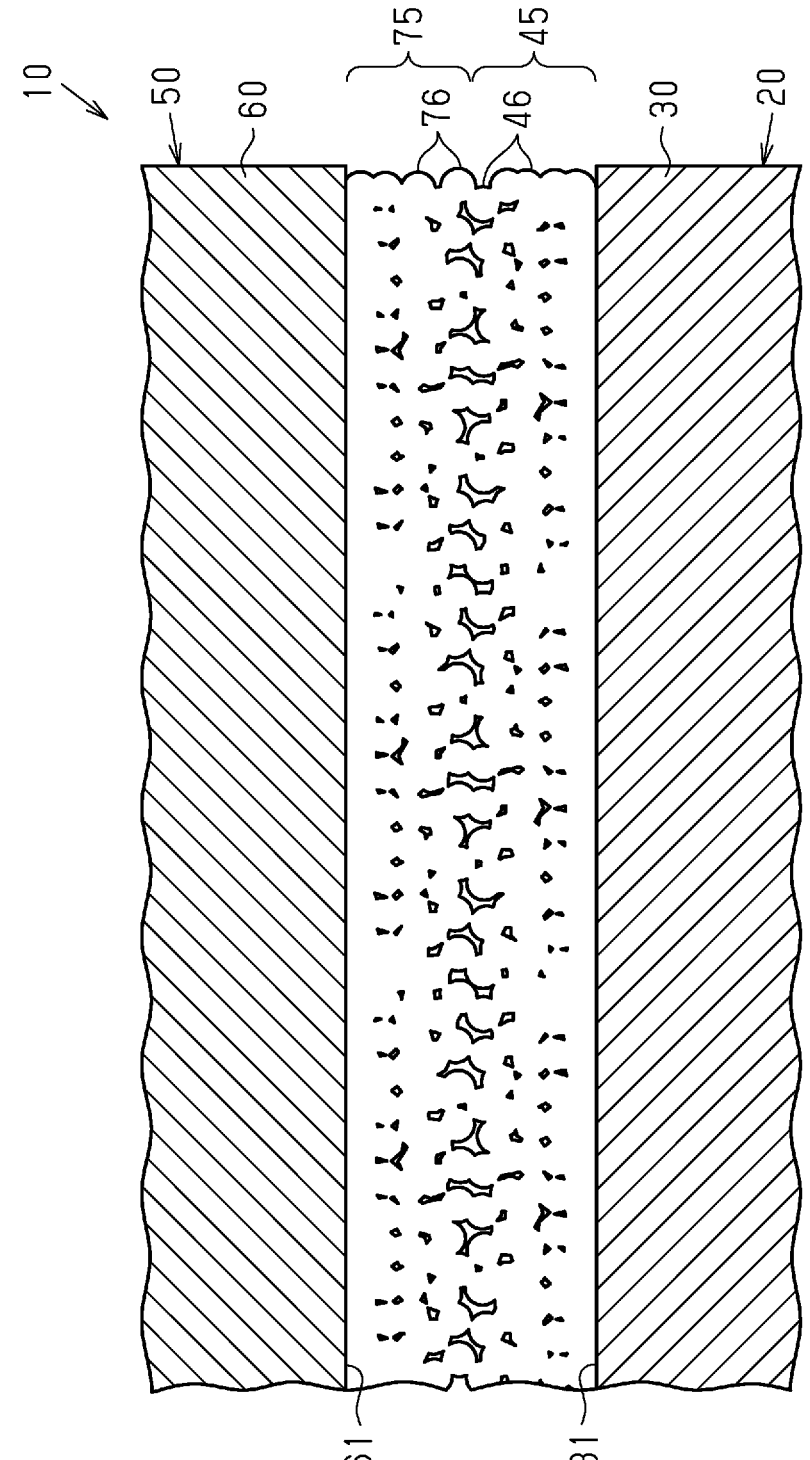
FIG. 10 is a schematic cross-sectional view illustrating part of the semiconductor device in FIG. 9.

As illustrated in FIGS. 9 and 10, the semiconductor device 10 includes the wiring substrate 20. The wiring substrate 20 includes the first connection terminal 30 and a first roughened-surface copper metal film 45 formed on the first opposing surface 31 of the first connection terminals 30. In the wiring substrate 20 of the second embodiment, the first roughened-surface copper metal film 45 is formed instead of the first roughened-surface copper metal film 40 on the first opposing surface 31 illustrated in FIG. 1. Further, the semiconductor device 10 includes the semiconductor element 50. The semiconductor element 50 includes the second connection terminal 60 and a second roughened-surface copper metal film 75 formed on the second opposing surface 61 of the second connection terminal 60. In the semiconductor element 50 of the second embodiment, the second roughened-surface copper metal film 75 is formed instead of the second roughened-surface copper metal film 70 illustrated in FIG. 1 on the second opposing surface 61.

First Roughened-Surface Copper Metal Film 45

As illustrated in FIG. 9, the first roughened-surface copper metal film 45, for example, entirely covers the first opposing surface 31. The first roughened-surface copper metal film 45 is directly bonded to the first opposing surface 31. The first roughened-surface copper metal film 45 is integrated with the first connection terminal 30. In the drawings, the first roughened-surface copper metal film 45 is distinguished from the first connection terminal 30 by a solid line to facilitate understanding. Actually, there may be no interface between the first connection terminal 30 and the first roughened-surface copper metal film 45 and the boundary may be unclear. The first roughened-surface copper metal film 45 may have a thickness (film thickness), for example, in a range from 0.5 μm or greater to 2 μm or less.

The first roughened-surface copper metal film 45 has a surface (both upper and side surfaces or only upper surface) with a structure of microscopic irregularities. The first roughened-surface copper metal film 45 includes a structure in which granulated first deposits 46, which are formed from a plating metal of copper, are piled over one another on the first opposing surface 31 of the first connection terminal 30. The first roughened-surface copper metal film 45 includes a structure in which pores are formed between the granulated first deposits 46. The first roughened-surface copper metal film 45 is a plating film formed in an electrolytic copper plating process. The first roughened-surface copper metal film 45 is, for example, a metal film formed by a plating film including only copper.

The granulated first deposits 46 are, for example, spherical. The granulated first deposits 46 may have a particle diameter, for example, in a range from 20 nm or greater to 100 nm or less. Preferably, the particle diameter of the granulated first deposits 46 is for example, in a range from 20 nm or greater to 50 nm or less. The first roughened-surface copper metal film 45 has a structure including stacked layers of a large number of granulated first deposits 46. Further, the first roughened-surface copper metal film 45 has a three-dimensional nanostructure formed by a large number of first deposits 46, which are nanoscale microscopic granules, intersecting one another in random directions and piled over one another in a multi-layer-like manner. Such a first roughened-surface copper metal film 45 is formed to have a structure in which the granulated first deposits 46 are densely piled over one another such that a large number of pores are formed between the first deposits 46. The structure extends over the entire first roughened-surface copper metal film 45 in the thickness-wise direction of the first roughened-surface copper metal film 45. That is, the first roughened-surface copper metal film 45 includes a large number of microscopic pores throughout the first roughened-surface copper metal film 45 in the thickness-wise direction. The density of the first deposits 46 varies, for example, in the thickness-wise direction of the first roughened-surface copper metal film 45. For example, the density of the first deposits 46 increases toward the first opposing surface 31 in the thickness-wise direction of the first roughened-surface copper metal film 45. The overall porosity of the first roughened-surface copper metal film 45 may be, for example, in a range from 10% or greater to 25% or less.

In this manner, the first roughened-surface copper metal film 45 includes a structure in which a large number of granulated first deposits 46 are piled over one another. Thus, the first roughened-surface copper metal film 45 has a roughened surface structure in which the surface is uneven and a large number of pores are included in the thickness-wise direction.

Second Roughened-Surface Copper Metal Film 75

The second roughened-surface copper metal film 75, for example, entirely covers the second opposing surface 61. The second roughened-surface copper metal film 75 is directly bonded to the second opposing surface 61. The second roughened-surface copper metal film 75 is integrated with the second connection terminal 60. In the drawings, the second roughened-surface copper metal film 75 is distinguished from the second connection terminal 60 by a solid line to facilitate understanding. Actually, there may be no interface between the second connection terminal 60 and the second roughened-surface copper metal film 75 and the boundary may be unclear. The second roughened-surface copper metal film 75 may have a thickness (film thickness), for example, in a range from 0.5 μm or greater to 2 μm or less.

The second roughened-surface copper metal film 75 has a surface (both lower and side surfaces or only lower surface) with a structure of microscopic irregularities. The second roughened-surface copper metal film 75 includes a structure in which granulated second deposits 76, which are formed from a plating metal of copper, are piled over one another on the second opposing surface 61 of the second connection terminal 60. The second roughened-surface copper metal film 75 includes a structure in which pores are formed between the granulated second deposits 76. The second roughened-surface copper metal film 75 is a plating film formed in an electrolytic copper plating process. The second roughened-surface copper metal film 75 is, for example, a metal film formed by a plating film including only copper.

The granulated second deposits 76 are, for example, spherical. The granulated second deposits 76 may have a particle diameter, for example, in a range from 20 nm or greater to 100 nm or less. Preferably, the particle diameter of the granulated second deposits 76 is, for example, in a range from 20 nm or greater to 50 nm or less. The second roughened-surface copper metal film 75 has a structure including stacked layers of a large number of granulated second deposits 76. Further, the second roughened-surface copper metal film 75 has a three-dimensional nanostructure formed by a large number of second deposits 76, which are nanoscale microscopic granules, intersecting one another in random directions and piled over one another in a multi-layer-like manner. Such a second roughened-surface copper metal film 75 is formed to have a structure in which the granulated second deposits 76 are densely piled over one another such that a large number of pores are formed between the second deposits 76. The structure extends over the entire second roughened-surface copper metal film 75 in the thickness-wise direction of the second roughened-surface copper metal film 75. That is, the second roughened-surface copper metal film 75 includes a large number of microscopic pores throughout the second roughened-surface copper metal film 75 in the thickness-wise direction. The density of the second deposits 76 varies, for example, in the thickness-wise direction of the second roughened-surface copper metal film 75. For example, the density of the second deposits 76 increases toward the second opposing surface 61 in the thickness-wise direction of the second roughened-surface copper metal film 75. The overall porosity of the second roughened-surface copper metal film 75 may be, for example, in a range from 10% or greater to 25% or less.

In this manner, the second roughened-surface copper metal film 75 includes a structure in which a large number of granulated second deposits 76 are piled over one another. Thus, the second roughened-surface copper metal film 75 has a roughened surface structure in which the surface is uneven and a large number of pores are included in the thickness-wise direction.

As illustrated in FIG. 10, the second roughened-surface copper metal film 75 is bonded to the first roughened-surface copper metal film 45. The second roughened-surface copper metal film 75 is, for example, sintered and diffusion-bonded to the first roughened-surface copper metal film 45. No intermetallic compound is formed on the interface (bonding interface) between the first roughened-surface copper metal film 45 and the second roughened-surface copper metal film 75. Thus, the first roughened-surface copper metal film 45 of copper is directly bonded to the second roughened-surface copper metal film 75 of copper without another member formed from a material other than copper.

A bonded portion of the first roughened-surface copper metal film 45 and the second roughened-surface copper metal film 75 includes a structure in which the first deposits 46 and the second deposits 76 are piled. For example, in the bonded portion of the first roughened-surface copper metal film 45 and the second roughened-surface copper metal film 75, the first deposits 46 are sintered and diffusion-bonded to the second deposits 76. Thus, the first deposits 46 are integrated with the second deposits 76, and the first roughened-surface copper metal film 45 is integrated with the second roughened-surface copper metal film 75. The bonded portion of the first roughened-surface copper metal film 45 and the second roughened-surface copper metal film 75 has a structure in which the first deposits 46 are diffusion-bonded to the second deposits 76 in a state including pores. The porosity of the bonded portion of the first roughened-surface copper metal film 45 and the second roughened-surface copper metal film 75 may be, for example, in a range from 7% or greater to 20% or less. The porosity of the bonded portion of the first roughened-surface copper metal film 45 and the second roughened-surface copper metal film 75 is greater than the porosity inside the first roughened-surface copper metal film 45 and the porosity inside the second roughened-surface copper metal film 75. Here, the porosity inside the first roughened-surface copper metal film 45 may correspond to a porosity of the first roughened-surface copper metal film 45 except the bonded portion. The porosity inside the second roughened-surface copper metal film 75 may correspond to a porosity of the second roughened-surface copper metal film 75 except the bonded portion. In other words, the bonded portion of the first roughened-surface copper metal film 45 and the second roughened-surface copper metal film 75 has the highest porosity among the first roughened-surface copper metal film 45, the second roughened-surface copper metal film 75, and the bonded portion of the first roughened-surface copper metal film 45 and the second roughened-surface copper metal film 75. The porosity of the first roughened-surface copper metal film 45 decreases from the bonded portion of the first roughened-surface copper metal film 45 and the second roughened-surface copper metal film 75 toward the first opposing surface 31 in the thickness-wise direction of the first roughened-surface copper metal film 45. Also, the porosity of the second roughened-surface copper metal film 75 decreases from the bonded portion of the first roughened-surface copper metal film 45 and the second roughened-surface copper metal film 75 toward the second opposing surface 61 in the thickness-wise direction of the second roughened-surface copper metal film 75.

The bonded portion of the first roughened-surface copper metal film 45 and the second roughened-surface copper metal film 75 does not project outward from, for example, the side surface of the first connection terminal 30 or the side surface of the second connection terminal 60. In other words, the bonded portion of the first roughened-surface copper metal film 45 and the second roughened-surface copper metal film 75 does not include a surplus bonding metal member (solder or the like) projecting outward from the side surface of the first connection terminal 30 or the side surface of the second connection terminal 60 in a planar direction (left-right direction in FIG. 10). The first roughened-surface copper metal film 45 and the second roughened-surface copper metal film 75 allow the first connection terminal 30 to be bonded perpendicular to the second connection terminal 60.

A connection structural body of the second embodiment is formed by the first connection terminal 30, the first roughened-surface copper metal film 45, the second connection terminal 60, and the second roughened-surface copper metal film 75.

Method for Manufacturing Semiconductor Device 10

A method for manufacturing the semiconductor device 10 will now be described. In the manufacturing method of the second embodiment, only the step illustrated in FIG. 5 differs from that in the manufacturing method of the first embodiment. Thus, the step of forming the first roughened-surface copper metal film 45 and the second roughened-surface copper metal film 75 will be described below.

As illustrated in FIG. 9, the first roughened-surface copper metal film 45 is formed on the first opposing surface 31 of the first connection terminal 30. In the same manner as the first embodiment, the first roughened-surface copper metal film 45 may be formed in an electrolytic copper plating process in which an electrolytic copper plating bath including polyacrylic acid is used as a plating bath, and the first connection terminals 30 and the like are used as a plating power feeding layer. However, the composition of the plating bath and the electrodeposition condition for the electrolytic copper plating process are changed from that of the first embodiment. An example of a plating condition for forming the first roughened-surface copper metal film 45 will now be described. When using an electrolytic copper plating bath including polyacrylic acid, the composition of the plating bath and the electrodeposition condition are set as follows.

Second Plating Condition (1) Plating Bath Composition

Base bath:

$CuSO_4 \cdot 5H_2O$: 0.85 M $H_2SO_4$: 0.55 M

Additive agent:

Polyacrylic acid (molecular weight 5000): $5.0 \times 10^{-4}$ M (2) Electrodeposition Condition Current mode: Current regulation method Current amount: 2 $Ccm^{-2}$ Current density: 1 $Adm^{-2}$ Temperature: Room temperature Agitation: No Anode: Cu plate Cathode: Plating subject (wiring substrate or semiconductor element)

As described above, the composition of the plating bath and the electrodeposition condition are appropriately adjusted so that the first roughened-surface copper metal film 45 has a desired roughened surface structure.

Figure 11:
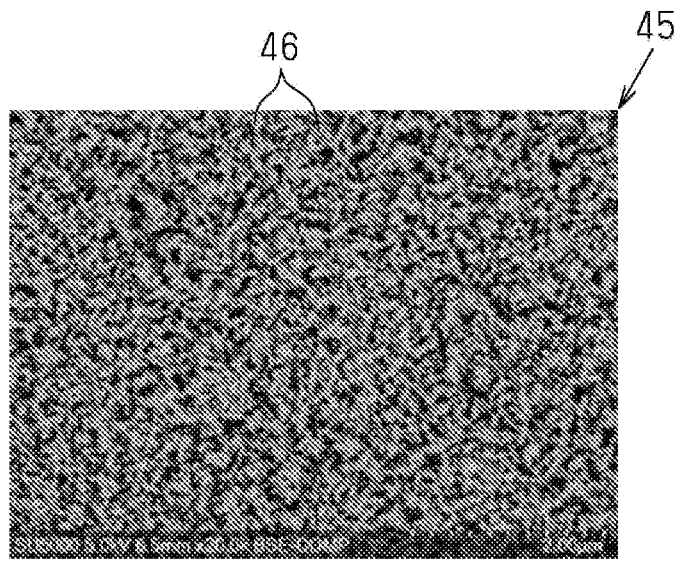
FIG. 11 is an SEM micrograph observing the surface of a first roughened-surface copper metal film in accordance with the second embodiment from above.

FIG. 11 is a scanning electron microscope (SEM) micrograph observing the surface of the first roughened-surface copper metal film 45 from above. The first roughened-surface copper metal film 45 is formed by the electrolytic copper plating process performed under the above-described second plating condition. The SEM image of FIG. 11 illustrates that the first roughened-surface copper metal film 45 has a roughened surface structure in which a large number of granulated first deposits 46 are piled over one another in random directions such that a large number of pores are formed between the first deposits 46. In other words, the SEM image of FIG. 11 illustrates that when the electrolytic copper plating process is performed under the above-described second plating condition, the first roughened-surface copper metal film 45 has a desired roughened surface structure. The first deposits 46 in the SEM image of FIG. 11 have a particle diameter in a range from 20 nm or greater to 100 nm or less.

The above-described plating bath composition and electrodeposition condition are merely examples and not particularly limited as long as the conditions are adjusted so that the first roughened-surface copper metal film 45 has a desired roughened surface structure. The shape and the density of the first deposits 46 in the first roughened-surface copper metal film 45 may be controlled by adjusting the concentration of polyacrylic acid, the current density, the current amount, the temperature of the plating bath, and the like in the electrolytic copper plating process.

Further, as illustrated in FIG. 9, the second roughened-surface copper metal film 75 is formed on the second opposing surface 61 of the second connection terminal 60. In the same manner in which the first roughened-surface copper metal film 45 is formed, the second roughened-surface copper metal film 75 may be formed by an electrolytic copper plating process that uses an electrolytic copper plating bath to which polyacrylic acid is added. The plating condition for this electrolytic copper plating step may be set to the same condition as the second plating condition for forming the first roughened-surface copper metal film 45. The second roughened-surface copper metal film 75 formed by such an electrolytic copper plating process has the same roughened surface structure illustrated by the SEM image of FIG. 11.

Subsequently, as illustrated in FIG. 10, the first roughened-surface copper metal film 45 is bonded to the second roughened-surface copper metal film 75. For example, the first roughened-surface copper metal film 45 is sintered and diffusion-bonded to the second roughened-surface copper metal film 75. In this step, bonding is performed by applying heat and pressure to the wiring substrate 20 and the semiconductor element 50 in a state in which the second roughened-surface copper metal film 75 is arranged on the first roughened-surface copper metal film 45. The heating temperature may be, for example, in a range from 180° C. or higher to 250° C. or lower. The pressure may be, for example, in a range from 8 MPa or greater to 15 MPa or less. The processing time of the heating and pressing process may be, for example, in a range from three minutes or longer to ten minutes or shorter. The heating and pressing process may be performed in the atmosphere. In such a heating and pressing process, the first roughened-surface copper metal film 45 is sintered and diffusion-bonded to the second roughened-surface copper metal film 75. In other words, the first deposits 46 of the first roughened-surface copper metal film 45 are sintered and diffusion-bonded to the second deposits 76 of the second roughened-surface copper metal film 75 to integrate the first deposits 46 with the second deposits 76. This bonds and integrates the first roughened-surface copper metal film 45 and the second roughened-surface copper metal film 75.

Figure 12:
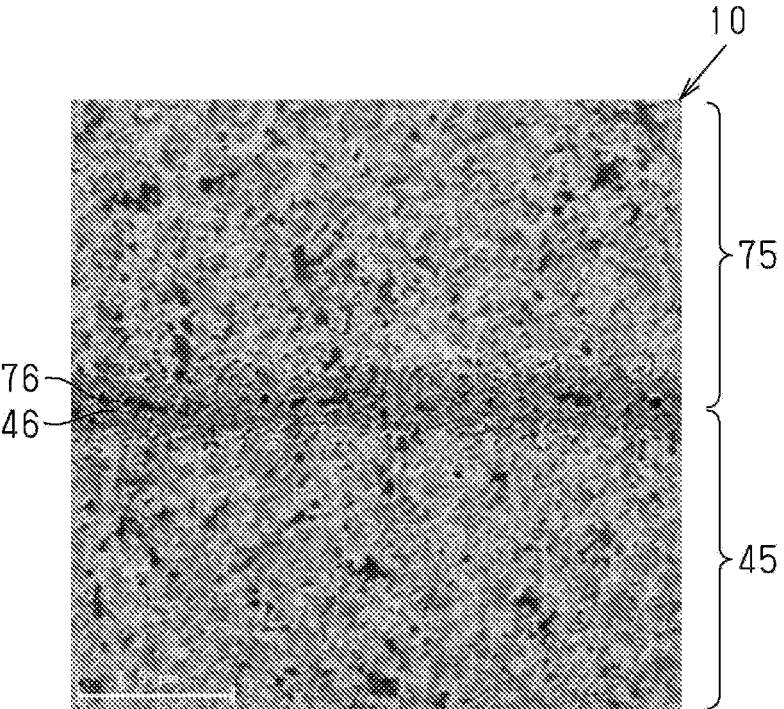
FIG. 12 is an SIM micrograph observing the cross-sectional structure of a connection structural body in accordance with the second embodiment.

FIG. 12 is an SIM micrograph observing the cross-sectional structure of the bonded portion when the first roughened-surface copper metal film 45 is bonded to the second roughened-surface copper metal film 75 in the heating and pressing process in which the heating temperature is set to 200° C., the pressure is set to 10 MPa, and the processing time is set to five minutes. The SIM image of FIG. 12 illustrates that the first deposits 46 are bonded to the second deposits 76 in a state in which pores are included in the bonded portion of the first roughened-surface copper metal film 45 and the second roughened-surface copper metal film 75. When the first deposits 46 are bonded to the second deposits 76, the first roughened-surface copper metal film 45 is bonded to and integrated with the second roughened-surface copper metal film 75. In other words, from the SIM image of FIG. 12, it may be confirmed that the first roughened-surface copper metal film 45 was bonded to the second roughened-surface copper metal film 75 in a heating and pressing process in which the heating temperature is set to 200° C., the pressure is set to 10 MPa, and the processing time is set to five minutes. Therefore, in the second embodiment, the first roughened-surface copper metal film 45 may be bonded to the second roughened-surface copper metal film 75 at a relatively low temperature (approximately 200° C.) in the same manner as the first embodiment.

The second embodiment has the same advantages as the first embodiment.

Third Embodiment

A third embodiment will now be described with reference to FIGS. 13 to 15. The semiconductor device 10 of the third embodiment differs from that of the first and second embodiments in the connection structural body. Hereafter, the difference from the first embodiment will be mainly described. The same reference numerals are given to those components that are the same as the corresponding components illustrated in FIGS. 1 to 12. Such elements will not be described in detail. FIG. 14 illustrates a cross-sectional structure of a connection structural body in a state before the semiconductor element 50 is mounted on the wiring substrate 20.

Figure 13:
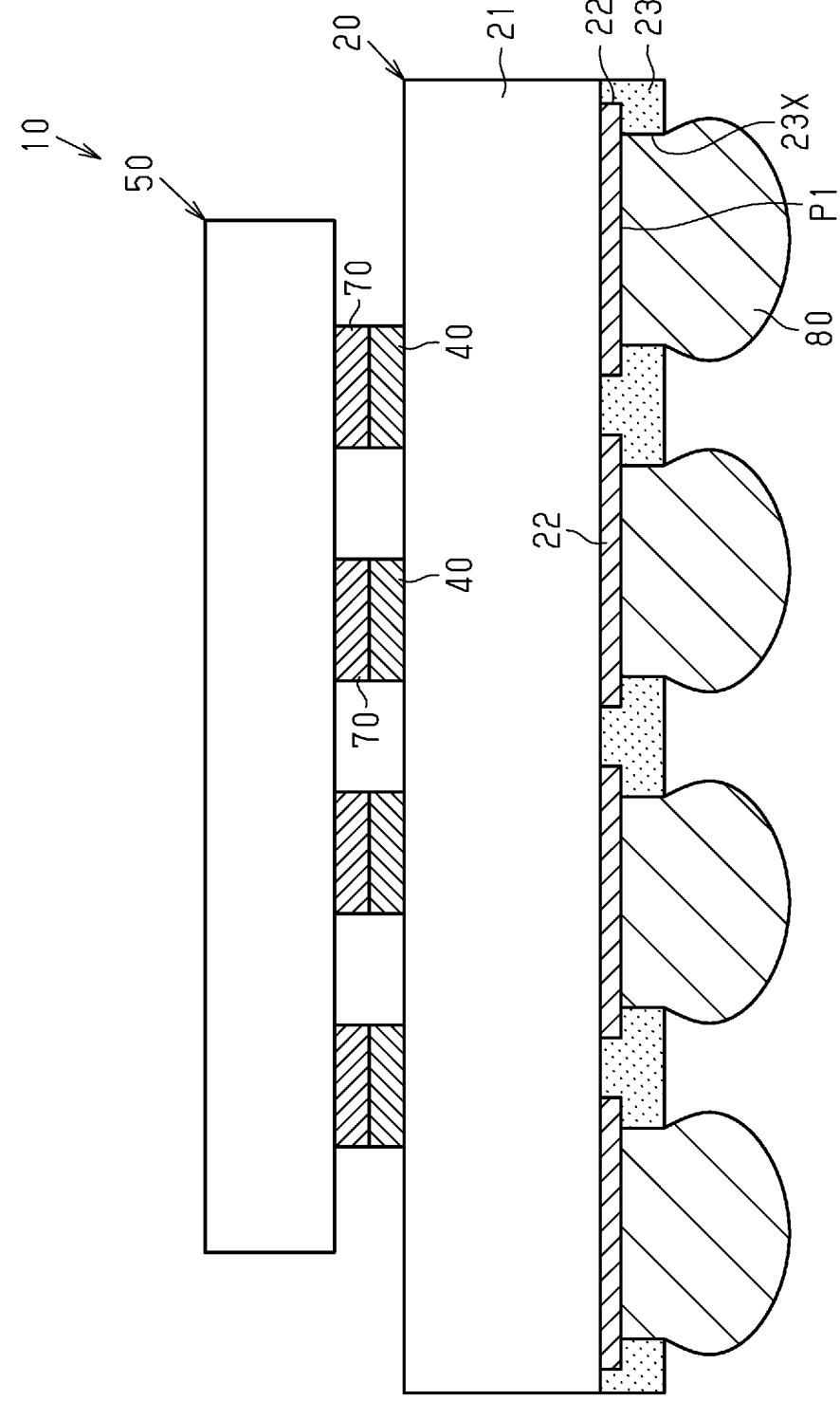
FIG. 13 is a schematic cross-sectional view of a semiconductor device in accordance with a third embodiment.
Figure 14:
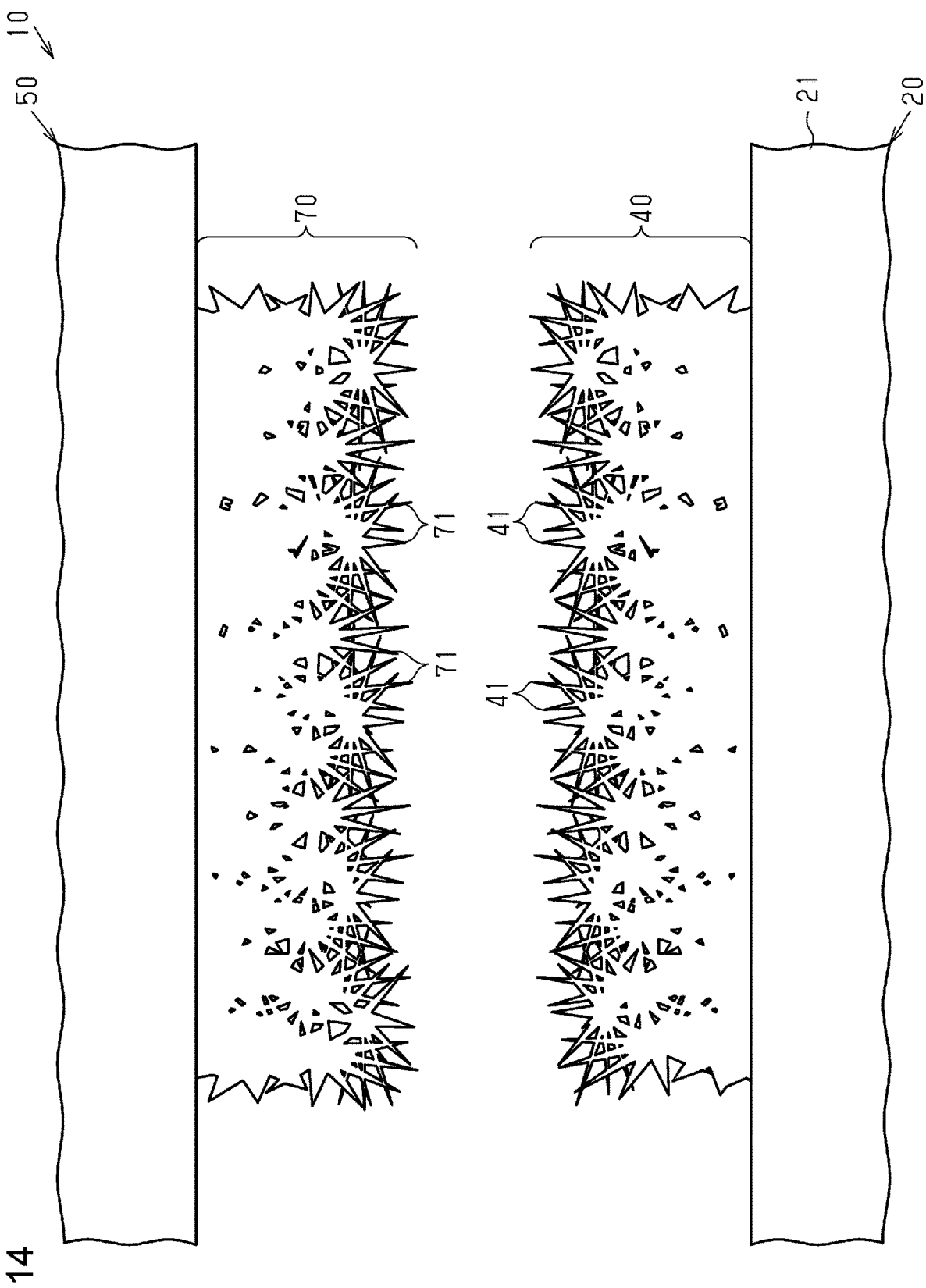
FIG. 14 is a schematic exploded cross-sectional view illustrating part of the semiconductor device in FIG. 13.

As illustrated in FIG. 13, the wiring substrate 20 of the third embodiment includes the first roughened-surface copper metal film 40 formed on the substrate body 21. The semiconductor element 50 of the third embodiment includes the second roughened-surface copper metal film 70 formed on the circuit formation surface (here, lower surface) of the semiconductor element 50. The second roughened-surface copper metal film 70 is bonded to the first roughened-surface copper metal film 40. In the semiconductor device 10 of the third embodiment, the semiconductor element 50 is mounted on the wiring substrate 20 when the second roughened-surface copper metal film 70 is bonded to the first roughened-surface copper metal film 40. In other words, in the semiconductor device 10 of the third embodiment, the first roughened-surface copper metal film 40 acts as first connection terminals for connection with the semiconductor element 50, and the second roughened-surface copper metal film 70 acts as second connection terminals for connection with the wiring substrate 20. In the semiconductor device 10 of the third embodiment, the first connection terminals are entirely formed by the first roughened-surface copper metal film 40, and the second connection terminals are entirely formed by the second roughened-surface copper metal film 70.

First Roughened-Surface Copper Metal Film 40

The first roughened-surface copper metal film 40 is formed on the upper surface of the substrate body 21. In the wiring substrate 20 of the third embodiment, a plurality of first roughened-surface copper metal films 40 is formed on the upper surface of the substrate body 21. Each first roughened-surface copper metal film 40 is provided on part of the upper surface of the substrate body 21. The first roughened-surface copper metal film 40 is electrically connected to the wiring layer 22 via, for example wiring layers and through-electrodes in the substrate body 21. The first roughened-surface copper metal film 40 may have a thickness (film thickness), for example, in a range from 1 µm or greater to 20 µm or less.

As illustrated in FIG. 14, the first roughened-surface copper metal film 40 is a plating film having a roughened surface (both upper and side surfaces or only upper surface). The surface (roughened surface) of the first roughened-surface copper metal film 40 includes microscopic irregularities. The first roughened-surface copper metal film 40 includes a structure in which sheeted first deposits 41, which are formed from a plating metal of copper, are piled over one another on the substrate body 21. The first roughened-surface copper metal film 40 includes a structure in which pores are formed between the sheeted first deposits 41. The first roughened-surface copper metal film 40 is a plating film formed by an electrolytic copper plating process. The first roughened-surface copper metal film 40 is, for example, a metal film formed by a plating film including only copper.

The first roughened-surface copper metal film 40 is formed on, for example, a seed layer (not illustrated) formed on the upper surface of the substrate body 21. For example, the first roughened-surface copper metal film 40 is integrated with the seed layer. The material of the seed layer may be, for example, copper or a copper alloy.

Second Roughened-Surface Copper Metal Film 70

As illustrated in FIG. 13, the second roughened-surface copper metal film 70 is formed on the circuit formation surface of the semiconductor element 50. In the third embodiment, a plurality of second roughened-surface copper metal films 70 is formed on the circuit formation surface of the semiconductor element 50. Each second roughened-surface copper metal film 70 is provided on part of the circuit formation surface of the semiconductor element 50. The second roughened-surface copper metal film 70 may have a thickness (film thickness), for example, in a range from 1 µm or greater to 20 µm or less.

As illustrated in FIG. 14, the second roughened-surface copper metal film 70 includes a structure in which microscopic irregularities are formed in a surface (both lower and side surfaces or only lower surface). The second roughened-surface copper metal film 70 includes a structure in which sheeted second deposits 71, which are formed from a plating metal of copper, are piled over one another on the circuit formation surface. The second roughened-surface copper metal film 70 includes a structure in which pores are formed between the sheeted second deposits 71. The second roughened-surface copper metal film 70 is a plating film formed by an electrolytic copper plating process. The second roughened-surface copper metal film 70 is, for example, a metal film formed by a plating film including only copper.

The second roughened-surface copper metal film 70 is formed on, for example, a seed layer (not illustrated) formed on the circuit formation surface of the semiconductor element 50. For example, the second roughened-surface copper metal film 70 is integrated with the seed layer. The material of the seed layer may be, for example, copper or a copper alloy.

Figure 15:
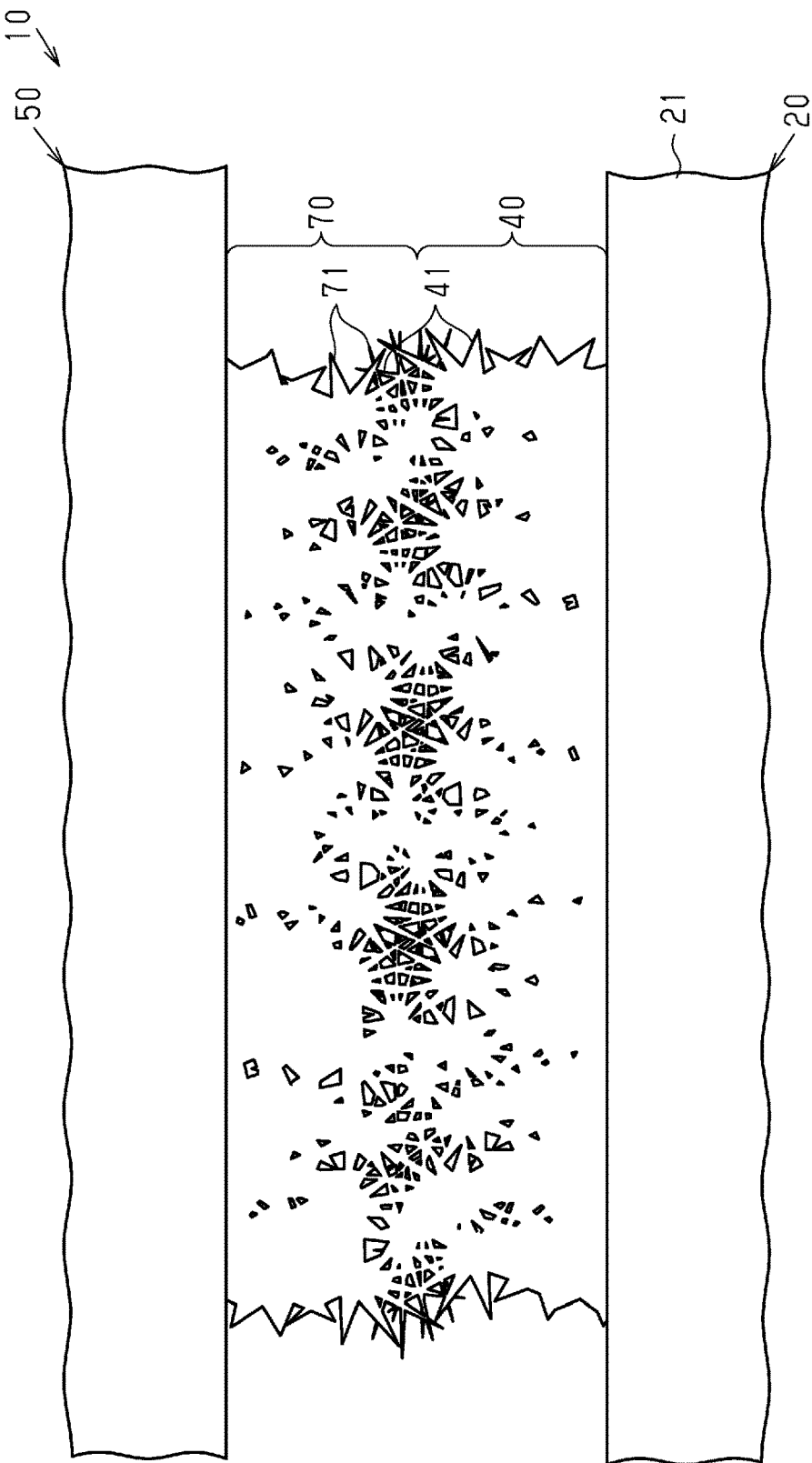
FIG. 15 is a schematic cross-sectional view illustrating part of the semiconductor device in FIG. 13.

As illustrated in FIG. 15, the second roughened-surface copper metal film 70 is bonded to the first roughened-surface copper metal film 40. The second roughened-surface copper metal film 70 is, for example, sintered and diffusion-bonded to the first roughened-surface copper metal film 40. No intermetallic compound is formed on the interface (bonding interface) between the first roughened-surface copper metal film 40 and the second roughened-surface copper metal film 70. Thus, the first roughened-surface copper metal film 40 of copper is directly bonded to the second roughened-surface copper metal film 70 of copper without another member formed from a material other than copper.

A bonded portion of the first roughened-surface copper metal film 40 and the second roughened-surface copper metal film 70 includes a structure in which the first deposits 41 and the second deposits 71 are piled. For example, in the bonded portion of the first roughened-surface copper metal film 40 and the second roughened-surface copper metal film 70, the first deposits 41 are sintered and diffusion-bonded to the second deposits 71. Thus, the first deposits 41 are integrated with the second deposits 71, and the first roughened-surface copper metal film 40 is integrated with the second roughened-surface copper metal film 70. The bonded portion of the first roughened-surface copper metal film 40 and the second roughened-surface copper metal film 70 has a structure in which the first deposits 41 are diffusion-bonded to the second deposits 71 in a state including pores. The porosity of the bonded portion of the first roughened-surface copper metal film 40 and the second roughened-surface copper metal film 70 may be, for example, in a range from 5% or greater to 18% or less. The porosity of the bonded portion of the first roughened-surface copper metal film 40 and the second roughened-surface copper metal film 70 is greater than the porosity inside the first roughened-surface copper metal film 40 and the porosity inside the second roughened-surface copper metal film 70. In other words, the bonded portion of the first roughened-surface copper metal film 40 and the second roughened-surface copper metal film 70 has the highest porosity among the first roughened-surface copper metal film 40, the second roughened-surface copper metal film 70, and the bonded portion of the first roughened-surface copper metal film 40 and the second roughened-surface copper metal film 70. The porosity of the first roughened-surface copper metal film 40 decreases from the bonded portion of the first roughened-surface copper metal film 40 and the second roughened-surface copper metal film 70 toward the wiring substrate 20 in the thickness-wise direction of the first roughened-surface copper metal film 40. Also, the porosity of the second roughened-surface copper metal film 70 decreases from the bonded portion of the first roughened-surface copper metal film 40 and the second roughened-surface copper metal film 70 toward the semiconductor element 50 in the thickness-wise direction of the second roughened-surface copper metal film 70.

A connection structural body of the third embodiment is formed by the first roughened-surface copper metal film 40 and the second roughened-surface copper metal film 70.

Method for Manufacturing Semiconductor Device 10

A method for manufacturing the semiconductor device 10 will now be described. A step of forming the first roughened-surface copper metal films 40 and the second roughened-surface copper metal films 70 will be described in detail.

As illustrated in FIG. 14, the first roughened-surface copper metal film 40 is formed on the upper surface of the substrate body 21. For example, first, a seed layer (not illustrated) is formed on the upper surface of the substrate body 21. The seed layer may be formed in, for example, an electrolytic copper plating process or a sputtering process. Then, a resist pattern (not illustrated) including open portions corresponding to the first roughened-surface copper metal films 40 is formed on the seed layer. Subsequently, an electrolytic copper plating process is performed to form the first roughened-surface copper metal films 40 in the open portions of the resist pattern. In the electrolytic copper plating process, the resist pattern is used as a plating mask, and the seed layer is used as a plating power feeding layer.

The plating condition for this electrolytic copper plating step may be set to the same condition as the first plating condition of the first embodiment.

Further, the second roughened-surface copper metal film 70 is formed on the circuit formation surface of the semiconductor element 50. For example, first, a seed layer (not illustrated) is formed on the circuit formation surface. The seed layer may be formed by, for example, an electrolytic copper plating process or a sputtering process. Then, a resist pattern (not illustrated) including open portions corresponding to the second roughened-surface copper metal films 70 is formed on the seed layer. Subsequently, an electrolytic copper plating process is performed to form the second roughened-surface copper metal films 70 in the open portions of the resist pattern. In the electrolytic copper plating process, the resist pattern is used as a plating mask, and the seed layer is used as a plating power feeding layer. The plating condition for this electrolytic copper plating step may be set to the same condition as the first plating condition of the first embodiment.

Then, as illustrated in FIG. 15, the first roughened-surface copper metal film 40 is bonded to the second roughened-surface copper metal film 70. In this step, bonding is performed by applying heat and pressure to the wiring substrate 20 and the semiconductor element 50 in a state in which the second roughened-surface copper metal film 70 is arranged on the first roughened-surface copper metal film 40. The heating temperature may be, for example, in a range from 180° C. or higher to 250° C. or lower. The pressure may be, for example, in a range from 8 MPa or greater to 15 MPa or less. The processing time of the heating and pressing process may be, for example, in a range from three minutes or longer to ten minutes or shorter. The heating and pressing process may be performed in the atmosphere. In such a heating and pressing process, the first roughened-surface copper metal film 40 may be sintered and diffusion-bonded to the second roughened-surface copper metal film 70.

The third embodiment has the same advantages as the first embodiment.

It should be apparent to those skilled in the art that the foregoing embodiments may be implemented in many other specific forms without departing from the scope of this disclosure. Particularly, it should be understood that the foregoing embodiments may be implemented in the following forms.

The above-described embodiments and the following modifications may be combined as long as the combined modifications remain technically consistent with each other.

In the first and second embodiments, the first roughened-surface copper metal film 40, 45 covers only the first opposing surface 31 among all of the surfaces of the first connection terminal 30. However, there is no limitation to such a structure.

Figure 16:
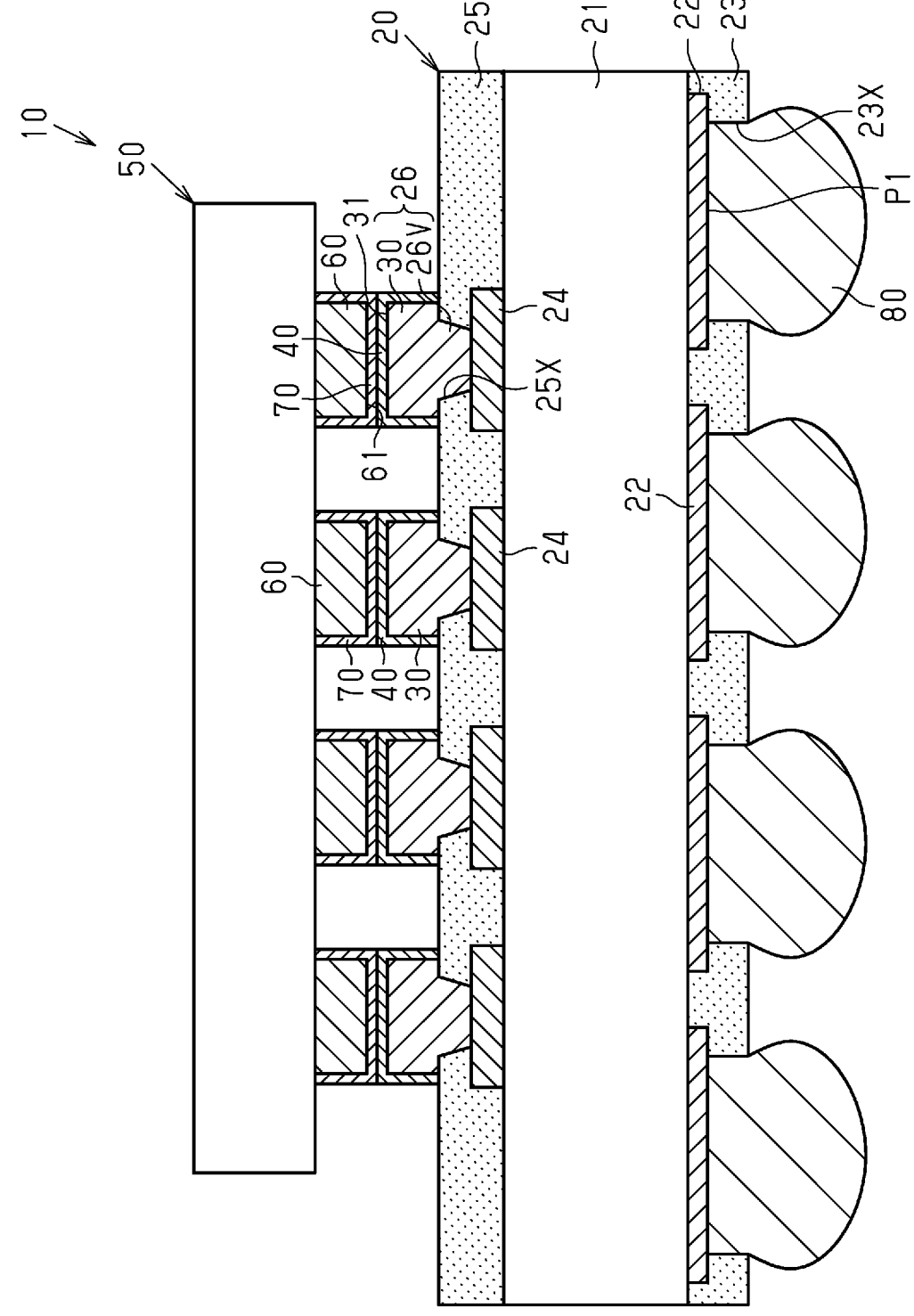
FIG. 16 is a schematic cross-sectional view illustrating a semiconductor device of a modified example.

For example, as illustrated in FIG. 16, the first roughened-surface copper metal film 40 may cover the side surface and the first opposing surface 31 of the first connection terminal 30. In the same manner, the first roughened-surface copper metal film 45 (refer to FIG. 9) may cover the side surface and the first opposing surface 31 of the first connection terminal 30.

In the first and second embodiments, the second roughened-surface copper metal film 70, 75 covers only the second opposing surface 61 among all of the surfaces of the second connection terminal 60. However, there is no limitation to such a structure.

For example, as illustrated in FIG. 16, the second roughened-surface copper metal film 70 may cover the side surface and the second opposing surface 61 of the second connection terminal 60. In the same manner, the second roughened-surface copper metal film 75 (refer to FIG. 9) may cover the side surface and the second opposing surface 61 of the second connection terminal 60.

In the first and second embodiments, the first roughened-surface copper metal film 40, 45 is directly bonded to the first opposing surface 31 of the first connection terminal 30. However, there is no limitation to such a structure. For example, a surface-processed layer may be formed to cover the first opposing surface 31 of the first connection terminal 30, and then the first roughened-surface copper metal film 40, 45 may be formed on the surface-processed layer. The surface-processed layer may be, for example, a metal layer such as a Au layer, a Ni layer/Au layer, or a Ni layer/Pd layer/Au layer.

In the first and second embodiments, the second roughened-surface copper metal film 70, 75 is directly bonded to the second opposing surface 61 of the second connection terminal 60. However, there is no limitation to such a structure. For example, a surface-processed layer may be formed to cover the second opposing surface 61 of the second connection terminal 60, and then the second roughened-surface copper metal film 70, 75 may be formed on the surface-processed layer. The surface-processed layer may be, for example, a metal layer such as a Au layer, a Ni layer/Au layer, or a Ni layer/Pd layer/Au layer.

In the first and second embodiments, the first roughened-surface copper metal film 40, 45 is formed on the first connection terminal 30 of the wiring layer 26. However, there is no limitation to such a structure. For example, the wiring layer 26 may be entirely formed by the first roughened-surface copper metal film 40, 45. In other words, the first roughened-surface copper metal film 40, 45 may form the via wiring 26V and the first connection terminal 30. In this case, the first roughened-surface copper metal film 40, 45, is formed on the upper surface of the wiring layer 24 exposed from the open portion 25X. That is, the first roughened-surface copper metal film 40, 45 includes a structure in which the first deposits 41, 46, which are formed from a plating metal of copper, are piled over one another on the upper surface of the wiring layer 24 exposed from the open portion 25X.

In the first and third embodiments, the first roughened-surface copper metal film 40 and the second roughened-surface copper metal film 70 have the same roughened surface structure. However, the roughened surface structure may differ between the first roughened-surface copper metal film 40 and the second roughened-surface copper metal film 70. In the first and third embodiments, the first roughened-surface copper metal film 40 and the second roughened-surface copper metal film 70 are both formed by an electrolytic copper plating process performed under the first plating condition. However, there is no limitation to such a manner. For example, the first roughened-surface copper metal film 40 may be formed by an electrolytic copper plating process performed under the first plating condition, and the second roughened-surface copper metal film 70 may be formed by an electrolytic copper plating process performed under the second plating condition.

In the second embodiment, the first roughened-surface copper metal film 45 and the second roughened-surface copper metal film 75 have the same roughened surface structure. However, the roughened surface structure may differ between the first roughened-surface copper metal film 45 and the second roughened-surface copper metal film 75. In the second embodiment, the first roughened-surface copper metal film 45 and the second roughened-surface copper metal film 75 are both formed by an electrolytic copper plating process performed under the second plating condition. However, there is no limitation to such a manner. For example, the first roughened-surface copper metal film 45 may be formed by an electrolytic copper plating process performed under the second plating condition, and the second roughened-surface copper metal film 75 may be formed by an electrolytic copper plating process performed under the first plating condition.

In the third embodiment, the first roughened-surface copper metal film 40 may be changed to the first roughened-surface copper metal film 45.

In the third embodiment, the second roughened-surface copper metal film 70 may be changed to the second roughened-surface copper metal film 75.

In each embodiment, the structure of the wiring substrate 20 may be changed. For example, the wiring substrate 20 may have any structure as long as the first roughened-surface copper metal film 40, 45 is included.

In each embodiment, the structure of the semiconductor element 50 may be changed. For example, the semiconductor element 50 may have any structure as long as the second roughened-surface copper metal film 70, 75 is included.

In the first and second embodiments, the first connection terminal 30 is not limited to a metal post.

In the first and second embodiments, the second connection terminal 60 is not limited to a metal post.

In the first and second embodiments, the first connection terminal 30 may be formed from a metal material other than copper.

In the first and second embodiments, the second connection terminal 60 may be formed from a metal material other than copper.

In each embodiment, the external connection terminals 80 may be omitted from the semiconductor device 10.
Clause This disclosure further encompasses the following embodiments.

1. A method for manufacturing a connection structural body, the method including:

forming a first connection terminal including a first opposing surface;

forming a first roughened-surface copper metal film including a structure in which first deposits of copper are piled over one another on the first opposing surface through an electrolytic copper plating process;

forming a second connection terminal including a second opposing surface;

forming a second roughened-surface copper metal film including a structure in which second deposits of copper are piled over one another on the second opposing surface through an electrolytic copper plating process; and bonding the first roughened-surface copper metal film and the second roughened-surface copper metal film by applying heat and pressure to the first roughened-surface copper metal film and the second roughened-surface copper metal film in a state in which the first roughened-surface copper metal film is arranged on the second roughened-surface copper metal film, in which:

the first roughened-surface copper metal film and the second roughened-surface copper metal film are formed by an electrolytic copper plating process that uses an electrolytic copper plating bath to which polyacrylic acid is added; and the first deposits are diffusion-bonded to the second deposits in a state in which pores are included in a bonded portion of the first roughened-surface copper metal film and the second roughened-surface copper metal film.

All examples and conditional language recited herein are intended for pedagogical purposes to aid the reader in understanding the principles of the invention and the concepts contributed by the inventors to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:

1. A connection structural body, comprising:

a first connection terminal including a first opposing surface;

a first roughened-surface copper metal film formed on the first opposing surface;

a second connection terminal including a second opposing surface facing the first opposing surface; and a second roughened-surface copper metal film formed on the second opposing surface and bonded to the first roughened-surface copper metal film, wherein:

the first roughened-surface copper metal film includes a structure in which first deposits of copper are piled over one another on the first opposing surface;

the second roughened-surface copper metal film includes a structure in which second deposits of copper are piled over one another on the second opposing surface; and a bonded portion of the first roughened-surface copper metal film and the second roughened-surface copper metal film includes a structure in which the first deposits and the second deposits are piled such that the bonded portion includes pores;

the first roughened-surface copper metal film is formed such that a density of the first deposits increases toward the first opposing surface in a thickness-wise direction of the first roughened-surface copper metal film; and the second roughened-surface copper metal film is formed such that a density of the second deposits increases toward the second opposing surface in a thickness-wise direction of the second roughened-surface copper metal film.

2. The connection structural body according to claim 1, wherein:

the first deposits are sheeted, and the first roughened-surface copper metal film includes a structure in which the sheeted first deposits are piled over one another on the first opposing surface such that pores are formed between the sheeted first deposits; and the second deposits are sheeted, and the second roughened-surface copper metal film includes a structure in which the sheeted second deposits are piled over one another on the second opposing surface such that pores are formed between the sheeted second deposits.

3. The connection structural body according to claim 1, wherein:

the first deposits are granulated, and the first roughened-surface copper metal film includes a structure in which the granulated first deposits are piled over one another on the first opposing surface such that pores are formed between the granulated first deposits; and the second deposits are granulated, and the second roughened-surface copper metal film includes a structure in which the granulated second deposits are piled over one another on the second opposing surface such that pores are formed between the granulated second deposits.

4. The connection structural body according to claim 1, wherein a porosity of the bonded portion of the first roughened-surface copper metal film and the second roughened-surface copper metal film is greater than a porosity inside the first roughened-surface copper metal film and a porosity inside the second roughened-surface copper metal film.

5. The connection structural body according to claim 1, wherein:

the first connection terminal is formed from copper; and the second connection terminal is formed from copper.

6. The connection structural body according to claim 1, wherein:

the first roughened-surface copper metal film covers only the first opposing surface of the first connection terminal; and the second roughened-surface copper metal film covers only the second opposing surface of the second connection terminal.

7. The connection structural body according to claim 1, wherein:

the first roughened-surface copper metal film covers a side surface of the first connection terminal and the first opposing surface of the first connection terminal; and the second roughened-surface copper metal film covers a side surface of the second connection terminal and the second opposing surface of the second connection terminal.

8. The connection structural body according to claim 2, wherein:

a porosity of the bonded portion of the first roughened-surface copper metal film and the second roughened-surface copper metal film is in a range from 5% or greater to 18% or less.

9. The connection structural body according to claim 3, wherein:

a porosity of the bonded portion of the first roughened-surface copper metal film and the second roughened-surface copper metal film is in a range from 7% or greater to 20% or less.

10. A semiconductor device comprising:

a wiring substrate; and a semiconductor element mounted on the wiring substrate, wherein:

the wiring substrate includes a first connection terminal including a first opposing surface facing the semiconductor element, and a first roughened-surface copper metal film formed on the first opposing surface;

the semiconductor element includes a second connection terminal including a second opposing surface facing the first opposing surface, and a second roughened-surface copper metal film formed on the second opposing surface and bonded to the first roughened-surface copper metal film, wherein:

the first roughened-surface copper metal film includes a structure in which first deposits of copper are piled over one another on the first opposing surface;

the second roughened-surface copper metal film includes a structure in which second deposits of copper are piled over one another on the second opposing surface; and a bonded portion of the first roughened-surface copper metal film and the second roughened-surface copper metal film includes a structure in which the first deposits and the second deposits are piled such that the bonded portion includes pores;

the first roughened-surface copper metal film is formed such that a density of the first deposits increases toward the first opposing surface in a thickness-wise direction of the first roughened-surface copper metal film; and the second roughened-surface copper metal film is formed such that a density of the second deposits increases toward the second opposing surface in a thickness-wise direction of the second roughened-surface copper metal film.

* * * * *